(12) United States Patent
Kim et al.

(10) Patent No.: US 11,177,346 B2
(45) Date of Patent: Nov. 16, 2021

(54) SEMICONDUCTOR DEVICE

(71) Applicant: Samsung Electronics Co., Ltd., Suwon-si (KR)

(72) Inventors: Ki Hwan Kim, Suwon-si (KR); Sunguk Jang, Suwon-si (KR); Pankwi Park, Suwon-si (KR); Sangmoon Lee, Suwon-si (KR); Sujin Jung, Suwon-si (KR)

(73) Assignee: SAMSUNG ELECTRONICS CO., LTD., Gyeonggi-Do (KR)

(*) Notice: Subject to any disclaimer, the term of this patent is extended or adjusted under 35 U.S.C. 154(b) by 9 days.

(21) Appl. No.: 16/666,958

(22) Filed: Oct. 29, 2019

(65) Prior Publication Data

US 2020/0219976 A1 Jul. 9, 2020

(30) Foreign Application Priority Data

Jan. 7, 2019 (KR) .................. 10-2019-0001956
Jan. 28, 2019 (KR) .................. 10-2019-0010753
Jul. 5, 2019 (KR) .................. 10-2019-0081566

(51) Int. Cl.
*H01L 29/08* (2006.01)
*H01L 29/78* (2006.01)
*H01L 29/66* (2006.01)

(52) U.S. Cl.
CPC .... *H01L 29/0847* (2013.01); *H01L 29/66795* (2013.01); *H01L 29/785* (2013.01)

(58) Field of Classification Search
CPC ............... H01L 29/0847; H01L 29/785; H01L 29/66795; H01L 23/53257; H01L 23/5226; H01L 21/76805; H01L 21/76877; H01L 21/28568; H01L 23/53295; H01L 21/02071; H01L 21/02063
See application file for complete search history.

(56) References Cited

U.S. PATENT DOCUMENTS

| 8,785,285 B2 | 7/2014 | Tsai et al. |
| 8,962,400 B2 | 2/2015 | Tsai et al. |
| 9,412,870 B2 | 8/2016 | Wong et al. |
| 9,853,129 B2 | 12/2017 | Bauer et al. |
| 9,923,081 B1 | 3/2018 | Bao et al. |
| 10,090,147 B2 | 10/2018 | Yan et al. |

(Continued)

FOREIGN PATENT DOCUMENTS

| JP | 2008-016523 A | 1/2008 |
| KR | 10-0440078 | 7/2004 |

*Primary Examiner* — Stephen W Smoot
*Assistant Examiner* — Vicki B. Booker
(74) *Attorney, Agent, or Firm* — Harness, Dickey & Pierce, P.L.C.

(57) ABSTRACT

A semiconductor device including an active fin that protrudes from a substrate and forms a plurality of recess regions spaced apart from each other, a gate pattern between the plurality of recess regions that covers a lateral surface and a top surface of the active fin, a plurality of source/drain patterns in the plurality of recess regions, and a diffusion reduction region adjacent to each of a plurality of bottoms of the plurality of recess regions and each of a plurality of sidewalls of the plurality of recess regions, the diffusion reduction region including a dopant having a lower diffusion coefficient than phosphorus (P).

20 Claims, 20 Drawing Sheets

(56) References Cited

U.S. PATENT DOCUMENTS

| | | | |
|---|---|---|---|
| 2016/0087104 A1* | 3/2016 | Lee | H01L 29/66545 |
| | | | 257/192 |
| 2018/0076326 A1 | 3/2018 | Roh et al. | |
| 2018/0083109 A1 | 3/2018 | Yu et al. | |
| 2018/0175046 A1 | 6/2018 | Chiou et al. | |
| 2018/0190810 A1 | 7/2018 | Li et al. | |

* cited by examiner

SEMICONDUCTOR DEVICE

CROSS-REFERENCE TO RELATED APPLICATION

This U.S. nonprovisional application claims priority under 35 U.S.C § 119 to Korean Patent Application Nos. 10-2019-0001956 filed on Jan. 7, 2019, 10-2019-0010753 filed on Jan. 28, 2019, and 10-2019-0081566 filed on Jul. 5, 2019 in the Korean Intellectual Property Office, the entire contents of which are hereby incorporated by reference.

BACKGROUND

The present inventive concepts relate to a semiconductor device, and more particularly, to a semiconductor device including fin field effect transistors.

Semiconductor devices are beneficial in the electronic industry because of their small size, multi-functionality, and/or low fabrication cost. Semiconductor devices may encompass semiconductor memory devices storing logic data, semiconductor logic devices processing operations of logic data, and hybrid semiconductor devices having both memory and logic elements. Demand for semiconductor devices with high integration has increased with the advanced development of the electronic industry. For example, demand for semiconductor devices having high reliability, high speed, and/or multi-functionality has increased. Semiconductor devices have been gradually complicated and integrated to meet these requested characteristics.

SUMMARY

Some example embodiments of the present inventive concepts provide semiconductor devices capable of preventing or reducing short channel effects.

Advantages of the present inventive concepts are not limited to the mentioned above, and other advantages which have not been mentioned above will be clearly understood to those skilled in the art from the following description.

According to some example embodiments of the present inventive concepts, a semiconductor device may include an active fin that protrudes from a substrate and forms a plurality of recess regions spaced apart from each other, a gate pattern between the plurality of recess regions that covers a lateral surface and a top surface of the active fin, a plurality of source/drain patterns in the plurality of recess regions, and a diffusion reduction region adjacent to each of a plurality of bottoms of the plurality of recess regions and each of a plurality of sidewalls of the plurality of recess regions, the diffusion reduction region including a dopant having a lower diffusion coefficient than phosphorus (P).

According to some example embodiments of the present inventive concepts, a semiconductor device may include an active fin that protrudes from a substrate and forms a plurality of recess regions spaced apart from each other, a gate pattern between the plurality of recess regions that covers a top surface and a lateral surface of the active fin, a plurality of source/drain patterns in the plurality of recess regions, each of the plurality of source/drain patterns including a dopant having a lower diffusion coefficient than phosphorus (P), and a plurality of source/drain capping patterns that covers the plurality of source/drain patterns.

According to some example embodiments of the present inventive concepts, a semiconductor device may include an active fin that protrudes from a substrate and forms a plurality of recess regions spaced apart from each other, a gate pattern between the recess regions that covers a lateral surface and a top surface of the active fin, a plurality of source/drain patterns in each of the plurality of recess regions, each of the plurality of source/drain patterns including a first dopant, and a diffusion reduction region adjacent to each of a plurality of bottoms of the plurality of recess regions and each of a plurality of sidewalls of the plurality of recess regions, the diffusion reduction region including a second dopant having a same conductivity type as the first dopant, and the second dopant having a lower diffusion coefficient than the first dopant.

BRIEF DESCRIPTION OF THE DRAWINGS

The above and other advantages and/or features will become apparent by describing in detail some example embodiments with reference to the accompanying drawings.

DETAILED DESCRIPTION OF EMBODIMENTS

Some example embodiments of the present inventive concepts will now be described in detail with reference to the accompanying drawings to aid in clearly explaining the present inventive concepts.

Figure 1:
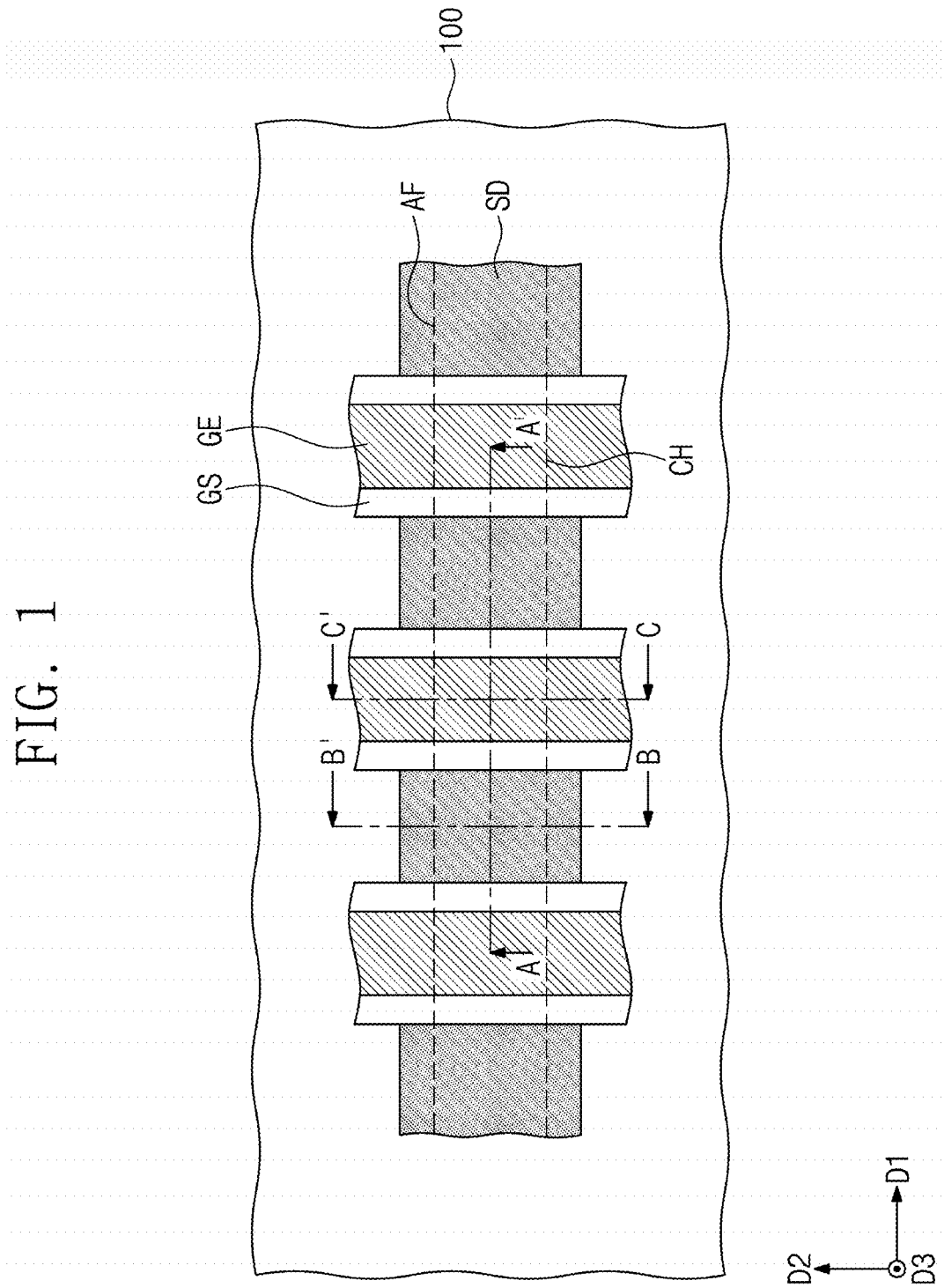
FIG. 1 illustrates a plan view showing a semiconductor device according to some example embodiments of the present inventive concepts.
Figure 2A:
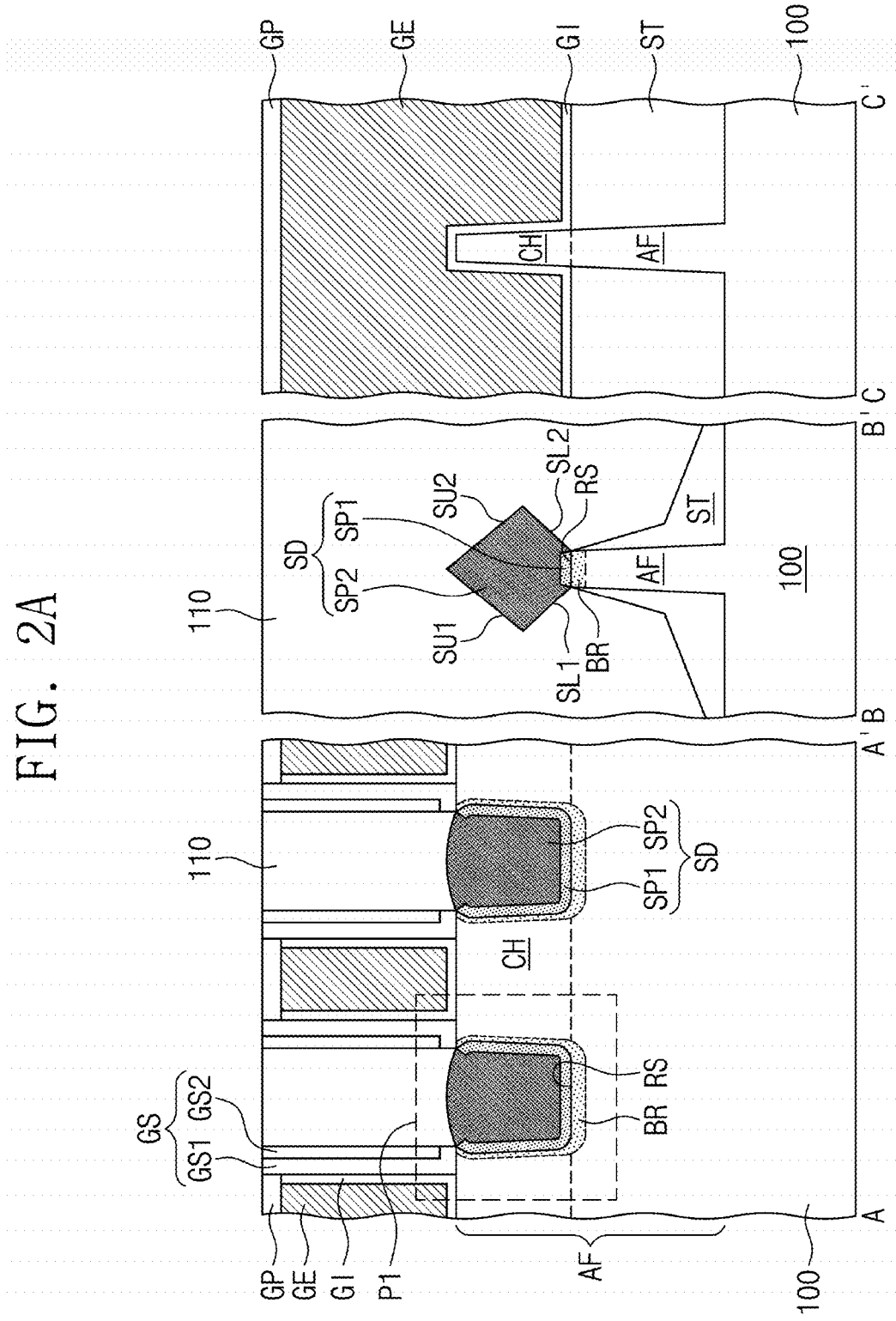
FIG. 2A illustrates a cross-sectional view taken along lines A-A', B-B', and C-C' of FIG. 1.
Figure 2B:
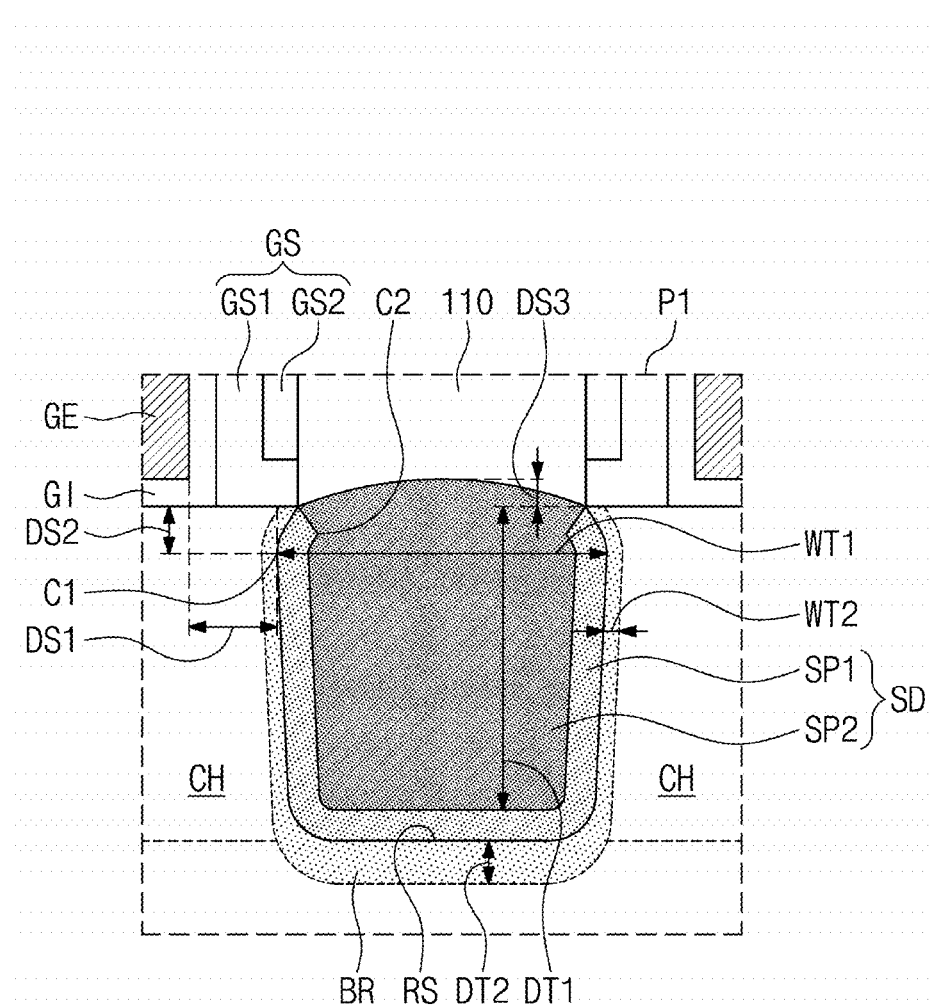
FIG. 2B illustrates an enlarged view showing section P1 of FIG. 2A.

FIG. 1 illustrates a plan view showing a semiconductor device according to some example embodiments of the present inventive concepts. FIG. 2A illustrates a cross-sectional view taken along lines A-A', B-B', and C-C' of FIG. 1. FIG. 2B illustrates an enlarged view showing section P1 of FIG. 2A.

Referring to FIGS. 1, 2A, and 2B, an active fin AF may protrude from a substrate 100. A device isolation layer ST may be disposed on the substrate 100 on a side of the active fin AF. The substrate 100 may be a single crystalline silicon substrate and/or a silicon-on-insulator (SOI) substrate. The device isolation layer ST may be formed of a single layer or multiple layers including one or more of a silicon oxide layer, a silicon nitride layer, and/or a silicon oxynitride layer. The active fin AF may have a bar or linear shape elongated in a first direction D1. A plurality of gate electrodes GE (also referred to herein as a "gate pattern") may run across the active fin AF in a second direction D2 intersecting the first direction D1. The gate electrodes GE may be spaced apart from each other in the first direction D1. Each of the gate electrodes GE may cover a top surface and/or a sidewall (e.g., lateral surface) of the active fin AF. The gate electrode GE may include a work function pattern and/or a metal line pattern.

The work function pattern may be an N-type work function pattern or a P-type work function pattern. The N-type work function pattern may include one or more of lanthanum (La), lanthanum oxide (LaO), tantalum (Ta), tantalum nitride (TaN), niobium (Nb), and/or titanium nitride (TiN). The P-type work function pattern may include one or more of aluminum (Al), aluminum oxide ($Al_2O_3$), titanium nitride (TiN), tungsten nitride (WN), and/or ruthenium oxide ($RuO_2$). The metal line pattern may include one or more of tungsten, copper, and/or aluminum. The gate electrode GE may further include a diffusion break pattern between the work function patter and the metal line pattern. The diffusion break pattern may include a metal nitride layer, such as a titanium nitride layer, a tantalum nitride layer, and/or a tungsten nitride layer.

A gate capping pattern GP may be disposed on the gate electrode GE. The gate capping pattern GP may be formed of, for example, a silicon nitride layer. A gate spacer GS may cover a sidewall of the gate electrode GE and/or a sidewall of the gate capping pattern GP. The gate spacer GS may include a first gate spacer GS1 in contact with the sidewall of the gate electrode GE and a second gate spacer GS2 in contact with a sidewall of the first gate spacer GS1. The first gate spacer GS1 may include a dielectric material having an etch selectivity with respect to the second gate spacer GS2. The first gate spacer GS1 may have, for example, an L-shaped cross-section. The first gate spacer GS1 and the second gate spacer GS2 may independently include a silicon oxide layer, a silicon nitride layer, and/or a silicon oxynitride layer.

A gate dielectric layer GI may be interposed between the active fin AF and the gate electrode GE. The gate dielectric layer GI may also be interposed between the gate spacer GS and the gate electrode GE. The gate dielectric layer GI may include a silicon oxide layer. The gate dielectric layer GI may further include a high-k dielectric layer whose dielectric constant is greater than that of a silicon oxide layer. The high-k dielectric layer may be formed of a material including one or more of hafnium oxide ($HfO_2$), hafnium silicate (HfSiO), hafnium oxynitride (HfON), hafnium silicon oxynitride (HfSiON), hafnium aluminum oxide ($HfAlO_3$), lanthanum oxide (LaO), lanthanum aluminum oxide (LaAlO), zirconium oxide (ZrO), zirconium silicate (ZrSiO), zirconium oxynitride (ZrON), zirconium silicon oxynitride (ZrSiON), titanium oxide ($TiO_2$), barium strontium titanium oxide (BaSrTiO), barium titanium oxide (BaTiO), strontium titanium oxide (SrTiO), yttrium oxide (YO), aluminum oxide ($Al_2O_3$), tantalum oxide ($Ta_2O_3$), and/or lead scandium tantalum oxide (PbScTaO).

Referring to FIGS. 2A and 2B, a recess region RS may be formed on the active fin AF exposed between neighboring gate electrodes GE. The recess region RS may have a width (in the D1 direction) that is changed (e.g., varies) based on position. The recess region RS may have a first width WT1, which is larger than any other width of the recess region RS, at a position (e.g., a first position C1) that is higher than a middle position (in the D3 direction) of the recess region RS and lower than the top surface of the active fin AF. The recess region RS may have a bottom surface having a first depth DT1 from the top surface of the active fin AF. A value of DT1/WT1 obtained by dividing the first depth DT1 by the first width WT1 may fall within a range of 2 to 3. For example, the first depth DT1 may be between two and three times the first width WT1.

The active fin AF may have therein a diffusion reduction region BR adjacent to a bottom and a sidewall (or the bottom and both sidewalls) of the recess region RS. A source/drain pattern SD may be disposed in the recess region RS. According to some example embodiments, the source/drain pattern SD refers to a structure or region that may be used as a source or a drain, as would be understood by a person of ordinary skill in the art. A channel region CH may be defined to refer to the active fin AF between the source/drain patterns SD. The source/drain pattern SD may include a first dopant having a first conductivity type. The diffusion reduction region BR may include a second dopant having the first conductivity type. The second dopant may have a diffusion coefficient less than that of the first dopant. The first dopant may have activation efficiency greater than that of the second dopant, where activation efficiency represents the degree of activation of a dopant during an annealing process.

For example, the first conductivity type may be N-type, and the first dopant may be phosphorus (P) and the second dopant may be arsenic (As). The semiconductor device may be an n-channel metal-oxide-semiconductor (NMOS) transistor. The diffusion reduction region BR may be doped with arsenic. A concentration of arsenic in the diffusion reduction region BR may range, for example, from 0.2 at % to 4 at % (relative to silicon per unit volume, or relative to silicon concentration). The diffusion reduction region BR may have a second width WT2 at a portion adjacent to the sidewall of the recess region RS and a second depth DT2 adjacent to the bottom of the recess region RS. The second depth DT2 may be greater than the second width WT2. The diffusion reduction region BR may further include carbon doped therein. A concentration of carbon may be, for example, less than 0.2 at % (relative to silicon per unit volume, or relative to silicon concentration).

At the first position C1 where the recess region RS has the largest width WT1, the source/drain pattern SD may be the most adjacent (e.g., nearest) to the gate electrode GE (e.g., with respect to other positions of the source/drain pattern SD). A first distance DS1 (e.g., in the D1 direction) from the sidewall of the gate electrode GE to the source/drain pattern SD may range, for example, from 0 to 10 nm. For example, a range from 0 to 10 nm may be given to a second distance DS2 (e.g., in the D3 direction) from the top surface of the active fin AF to the first position C1 where the recess region RS has the largest width WT1, or to a point where the source/drain pattern SD protrudes most laterally (e.g., in the D1 direction). An upper portion of the source/drain pattern SD may protrude outwardly from the recess region RS. An uppermost end of the source/drain pattern SD may be located at a third distance DS3 (e.g., in the D3 direction) away from the top surface of the active fin AF. The third distance DS3 may range, for example, from 0 to 5 nm.

The source/drain pattern SD may include a first sub-source/drain pattern SP1 that covers the bottom and the sidewall (or the bottom and both sidewalls) of the recess region RS and a second sub-source/drain pattern SP2 that fills the recess region RS (e.g., fills the first sub-source/drain pattern SP1, or the second sub-source/drain pattern SP2 and the first sub-source/drain pattern SP1 fill the recess region RS). The first sub-source/drain pattern SP1 may include the second dopant the same as or similar to that of the diffusion reduction region BR. The first sub-source/drain pattern SP1 may be a semiconductor epitaxial layer doped with the second dopant. For example, the first sub-source/drain pattern SP1 may be a silicon epitaxial layer doped with arsenic. A concentration of arsenic in the first sub-source/drain pattern SP1 may range, for example, from 0.2 at % to 4 at % (relative to silicon per unit volume, or relative to silicon concentration). The first sub-source/drain pattern SP1 may further include carbon doped therein. A concentration of carbon may be, for example, less than 0.2 at % (relative to silicon per unit volume, or relative to silicon concentration). The second sub-source/drain pattern SP2 may include the first dopant. For example, the second sub-source/drain pattern SP2 may be a silicon epitaxial layer doped with phosphorus. A concentration of phosphorus may range, for example, from 4 at % to 8 at % (relative to silicon per unit volume, or relative to silicon concentration).

In some example embodiments, the first sub-source/drain pattern SP1 and the second sub-source/drain pattern SP2 may both include the second dopant, but exclude or limit the first dopant. For example, the second dopant may be arsenic, and the first sub-source/drain pattern SP1 and the second sub-source/drain pattern SP2 may both be a silicon epitaxial layer doped with arsenic. However, the first sub-source/drain pattern SP1 and the second sub-source/drain pattern SP2 may have different concentrations of the second dopant from each other. For example, a concentration of the second dopant doped in the second sub-source/drain pattern SP2 may be greater than that of the second dopant doped in the first sub-source/drain pattern SP1. To be specific, a concentration of arsenic in the first sub-source/drain pattern SP1 may range from 0.2 at % to 4 at % (relative to silicon per unit volume, or relative to silicon concentration), and a concentration of arsenic in the second sub-source/drain pattern SP2 may range from 8 at % to 20 at % (relative to silicon per unit volume, or relative to silicon concentration).

In a cross-section along line A-A' of FIG. 2A or in FIG. 2B, a lateral surface (e.g., in the D1 direction) of the second sub-source/drain pattern SP2 may have an inflection C2 at a higher level (e.g., in the D3 direction) than that of the first position C1. The second sub-source/drain pattern SP2 may have a top end higher than that of the first sub-source/drain pattern SP1. In a cross-section along line B-B' of FIG. 2A, the second sub-source/drain pattern SP2 may have a diamond-shaped cross-section. For example, the second sub-source/drain pattern SP2 may include a first lower side SL1, a second lower side SL2 facing the first lower side SL1, a first upper side SU1 connected to the first lower side SL1, and a second upper side SU2 connected to the second lower side SL2. The second sub-source/drain pattern SP2 may cover lateral and/or top surfaces of the first sub-source/drain pattern SP1.

A space between the gate electrodes GE may be filled with an interlayer dielectric layer 110. The interlayer dielectric layer 110 may have a top surface coplanar or approximately coplanar with that of the gate capping pattern GP. The interlayer dielectric layer 110 may be formed of a single layer or multiple layers including one or more of a silicon oxide layer, a silicon nitride layer, a silicon oxynitride layer, and/or a porous dielectric layer.

Figure 3:
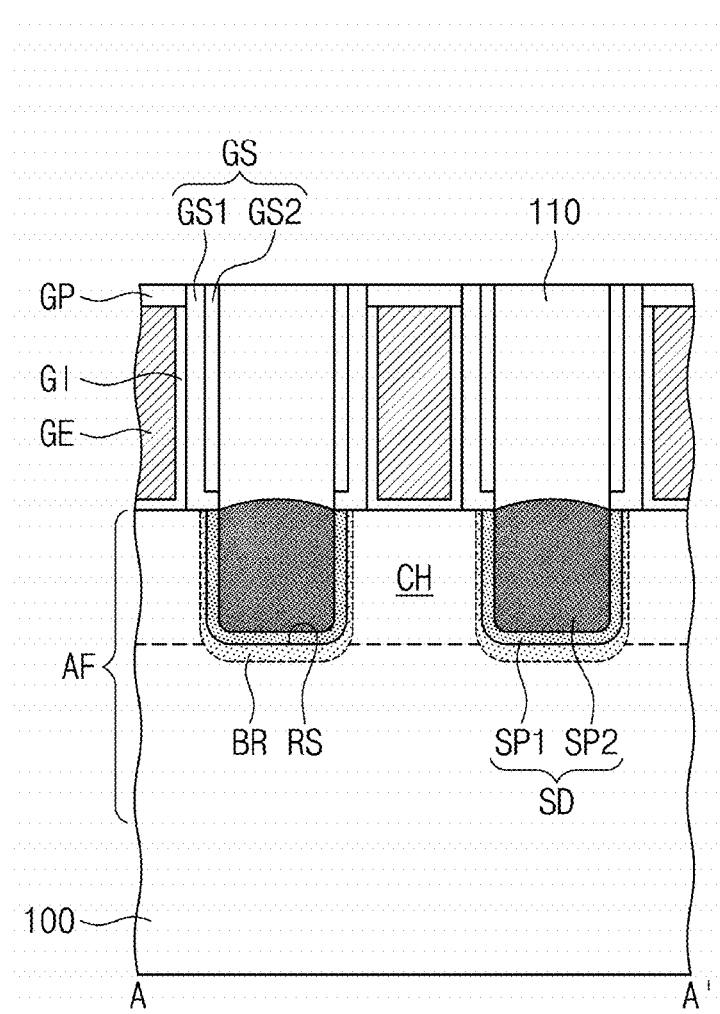
FIG. 3 illustrates a cross-sectional view taken along line A-A' of FIG. 1 depicting a source/drain pattern lacking the inflection C2 of FIG. 2B.

FIG. 3 illustrates a cross-sectional view taken along line A-A' of FIG. 1 depicting a source/drain pattern lacking the inflection C2 of FIG. 2B.

Referring to FIG. 3, a semiconductor device according to some example embodiments may be configured such that the recess region RS and the source/drain pattern SD have their shapes different from those illustrated in FIGS. 2A and 2B. The recess region RS may have a width that is constant or nearly constant regardless of position (e.g., position in the D3 direction). The lateral surface of the source/drain pattern SD may not include the inflection C2 of FIG. 2B. Other configurations may be identical or similar to those discussed with reference to FIGS. 1, 2A, and 2B.

Figure 4:
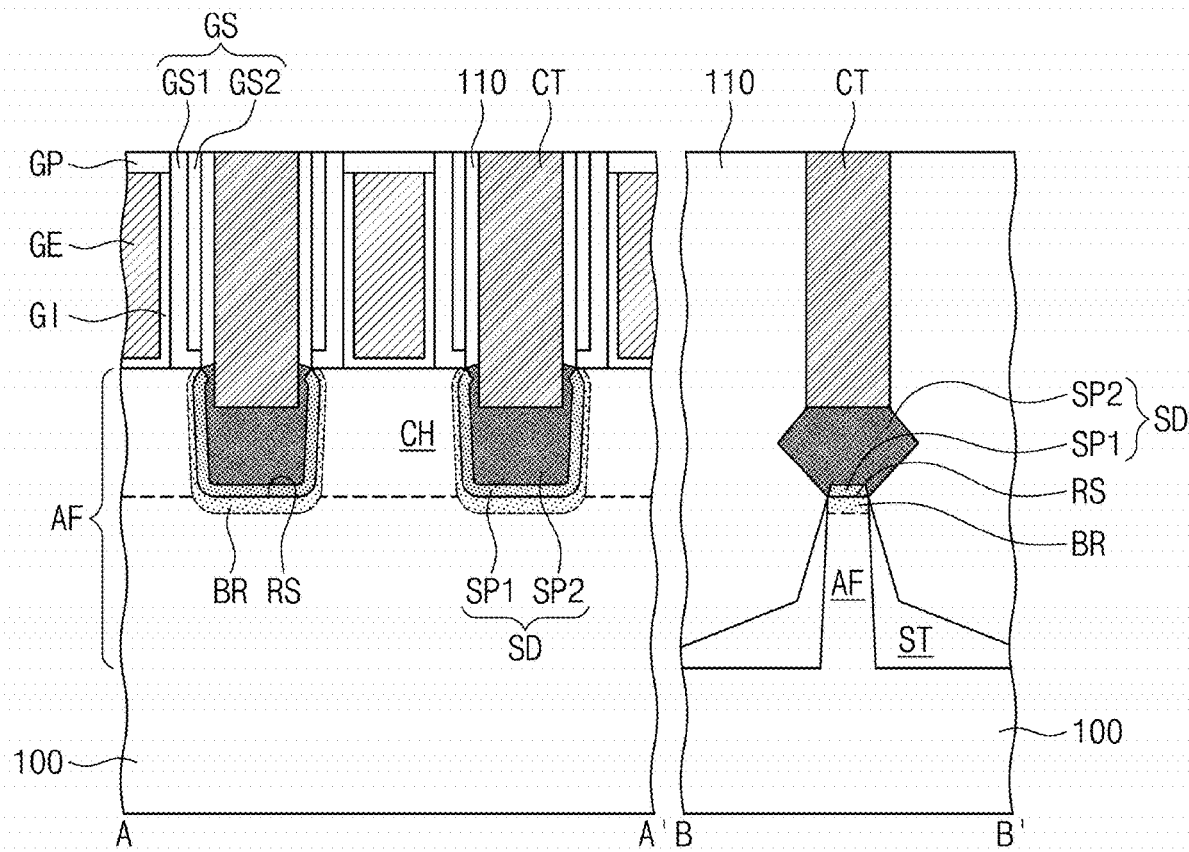
FIG. 4 illustrates a cross-sectional view taken along lines A-A' and B-B' of FIG. 1.

FIG. 4 illustrates a cross-sectional view taken along lines A-A' and B-B' of FIG. 1.

Referring to FIG. 4, a semiconductor device according to some example embodiments may further include a contact plug CT that penetrates the interlayer dielectric layer 110 and contacts the source/drain pattern SD. The contact plug CT may include a metal nitride layer, such as a titanium nitride layer, a tantalum nitride, and/or a tungsten nitride layer, and/or also include a metal layer, such as a tungsten layer, a copper layer, and/or an aluminum layer. In a cross-section along line A-A' of FIG. 4, the second sub-source/drain pattern SP2 of the source/drain pattern SD may cover a bottom surface and/or a lower lateral surface of the contact plug CT. In a cross-section along line B-B' of FIG. 4, the contact plug CT may be spaced apart from the first sub-source/drain pattern SP1 of the source/drain pattern SD.

A semiconductor device according to some example embodiments of the present inventive concepts may include the diffusion reduction region BR. The diffusion reduction region BR may include the second dopant whose diffusion coefficient is less than that of the first dopant included in the source/drain pattern SD, and thus the first dopant may be reduced or prevented from diffusing into the channel region CH and the active fin AF (or the substrate 100). In addition, the second dopant doped in the diffusion reduction region BR may relatively less diffuse than the first dopant. Therefore, a short channel effect may be prohibited or reduced.

Because the diffusion reduction region BR prohibits or reduces the short channel effect, the recess region RS may be formed to have a relatively large depth DT1 and/or the source/drain pattern SD may be formed to have a relatively high concentration of the first dopant. The first dopant has activation efficiency greater than that of the second dopant, and therefore, an increase in concentration of the first dopant may reduce a resistance of the source/drain pattern SD. The first dopant heavily doped in the second sub-source/drain pattern SP2 may induce a stress on the channel region CH, which may result in an increase in charge mobility. Further, a contact resistance between the second sub-source/drain pattern SP2 and the contact plug CT may be reduced to increase a device operating speed. When the semiconductor device is an NMOS transistor, the semiconductor device may increase in direct current (DC) performance.

In addition, a semiconductor device according to some example embodiments of the present inventive concepts may be configured such that the first sub-source/drain pattern SP1 including the second dopant may additionally reduce the diffusion of the first dopant included in the second sub-source/drain pattern SP2. Accordingly, it may be possible to prevent or reduce a short channel effect of the semiconductor device and to additionally increase a device operating speed.

When the second sub-source/drain pattern SP2 excludes or limits the first dopant (e.g., phosphorus) and includes the second dopant (e.g., arsenic) at high concentration, a short channel effect may be prevented or reduced and/or a resistance of the source/drain pattern SD may be reduced.

The following will describe a method of fabricating the semiconductor device of FIG. 2A. FIGS. 5A to 5D illustrate cross-sectional views showing a method of fabricating the semiconductor device of FIG. 2A.

Figure 5A:
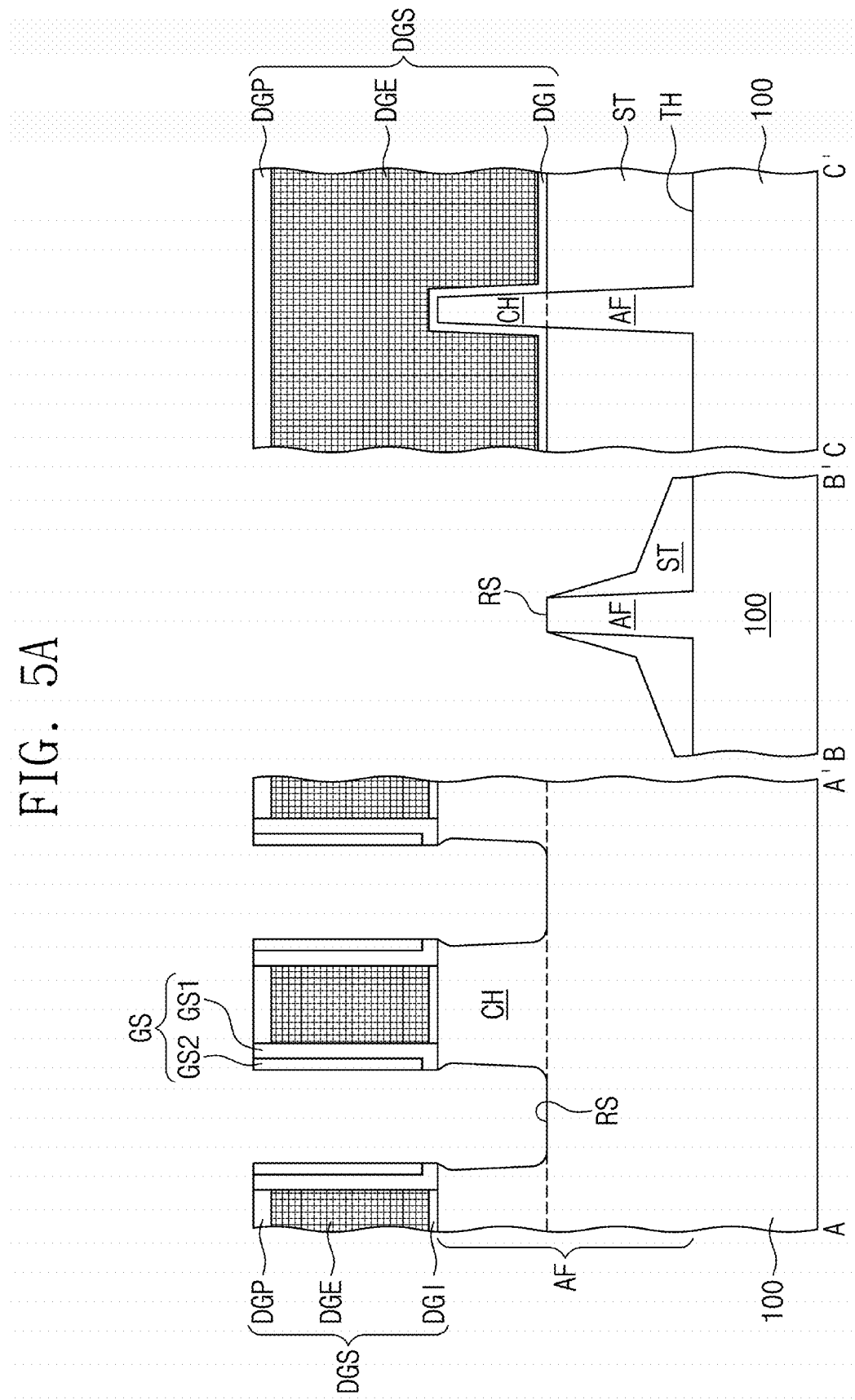
FIGS. 5A to 5D illustrate cross-sectional views showing a method of fabricating a semiconductor device of FIG. 2A.

Referring to FIG. 5A, a substrate 100 may be etched to form an active fin AF, and a trench TH may be formed to expose a lateral surface of the active fin AF. A device isolation layer ST may be formed to fill the trench TH. An upper portion of the device isolation layer ST may be removed to expose an upper portion of the active fin AF. A dummy gate structure DGS may be formed to run across the active fin AF. The dummy gate structure DGS may be formed to have the same shape at the same position, or a similar shape and a similar position, as those of the gate electrode GE of FIG. 1. The dummy gate structure DGS may include a dummy gate dielectric layer DGI, a dummy gate electrode DGE, and/or a dummy gate capping pattern DGP that are sequentially stacked. The dummy gate dielectric layer DGI may include, for example, a silicon oxide layer. The dummy gate electrode DGE may include, for example, a polysilicon layer. The dummy gate capping pattern DGP may include, for example, a silicon nitride layer. A gate spacer GS may be formed to cover a sidewall of the dummy gate structure DGS. The dummy gate capping pattern DGP and the gate spacer GS may be used as an etching mask through which the active fin AF may be etched to form a recess region RS. A density of an etching gas may become higher in an upper portion of the recess region RS, such that the recess region RS may have a width that is greater at the upper portion thereof than at a lower portion thereof. The etching process may also partially etch an upper portion of the device isolation layer ST.

Figure 5B:
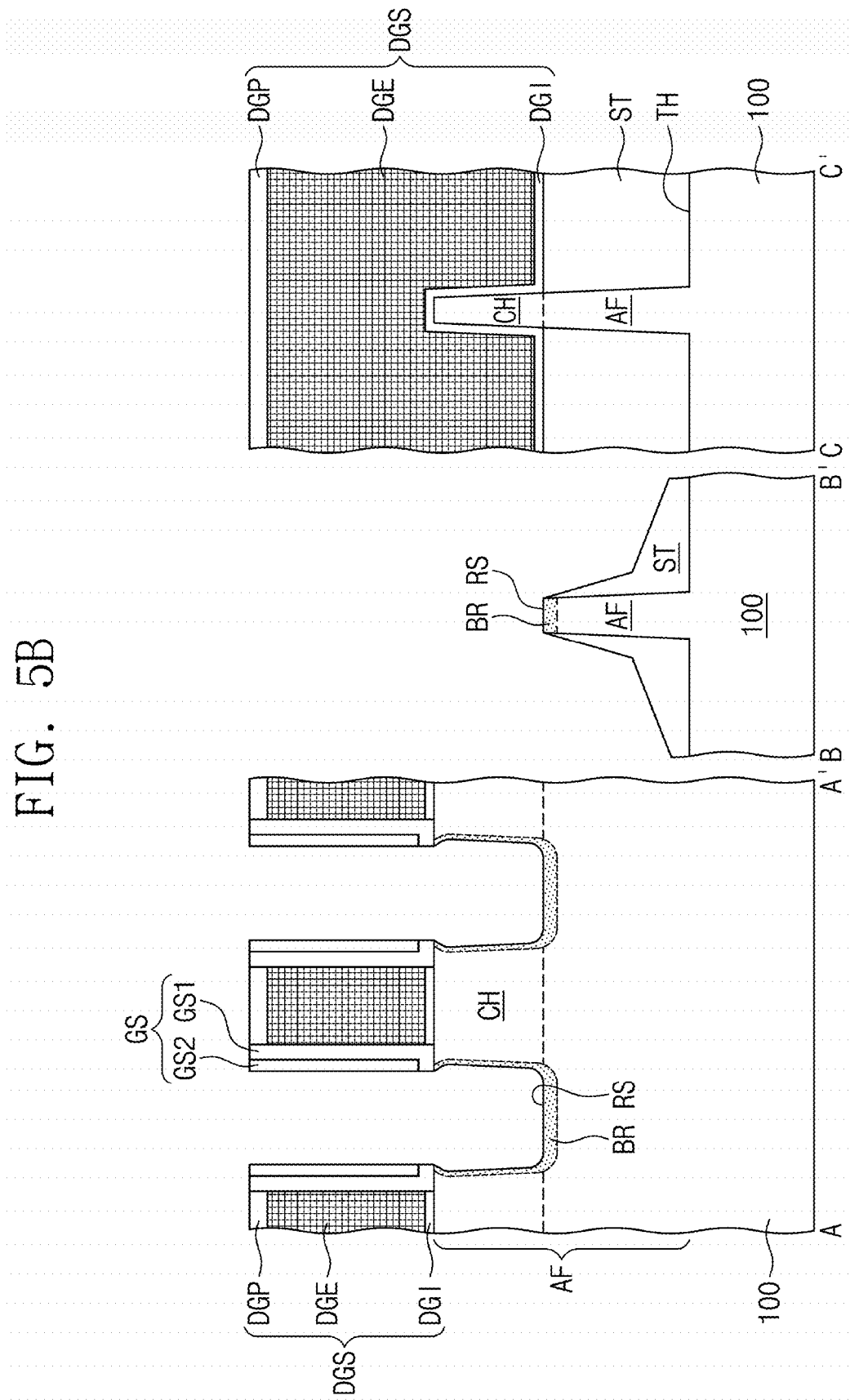

Referring to FIG. 5B, an ion implantation process (e.g., a tilted ion implantation process) may be performed to dope a second dopant (e.g., arsenic) into the active fin AF adjacent to a sidewall and a bottom of the recess region RS, and accordingly a diffusion reduction region BR may be formed.

After the ion implantation process, a heat treatment or annealing process may be additionally performed for activation of the second dopant. The activation may mean that the second dopant is combined with semiconductor atoms (e.g., silicon atoms) that constitute the substrate 100. The annealing process may be performed in two operations. Tertiary-butyl-arsine ($C_4H_{11}As$), or TBA, may be used as a source material of the second dopant. Carbon included in TBA may be slightly doped in the ion implantation process, and thus the diffusion reduction region BR may include a small quantity of carbon.

Figure 5C:
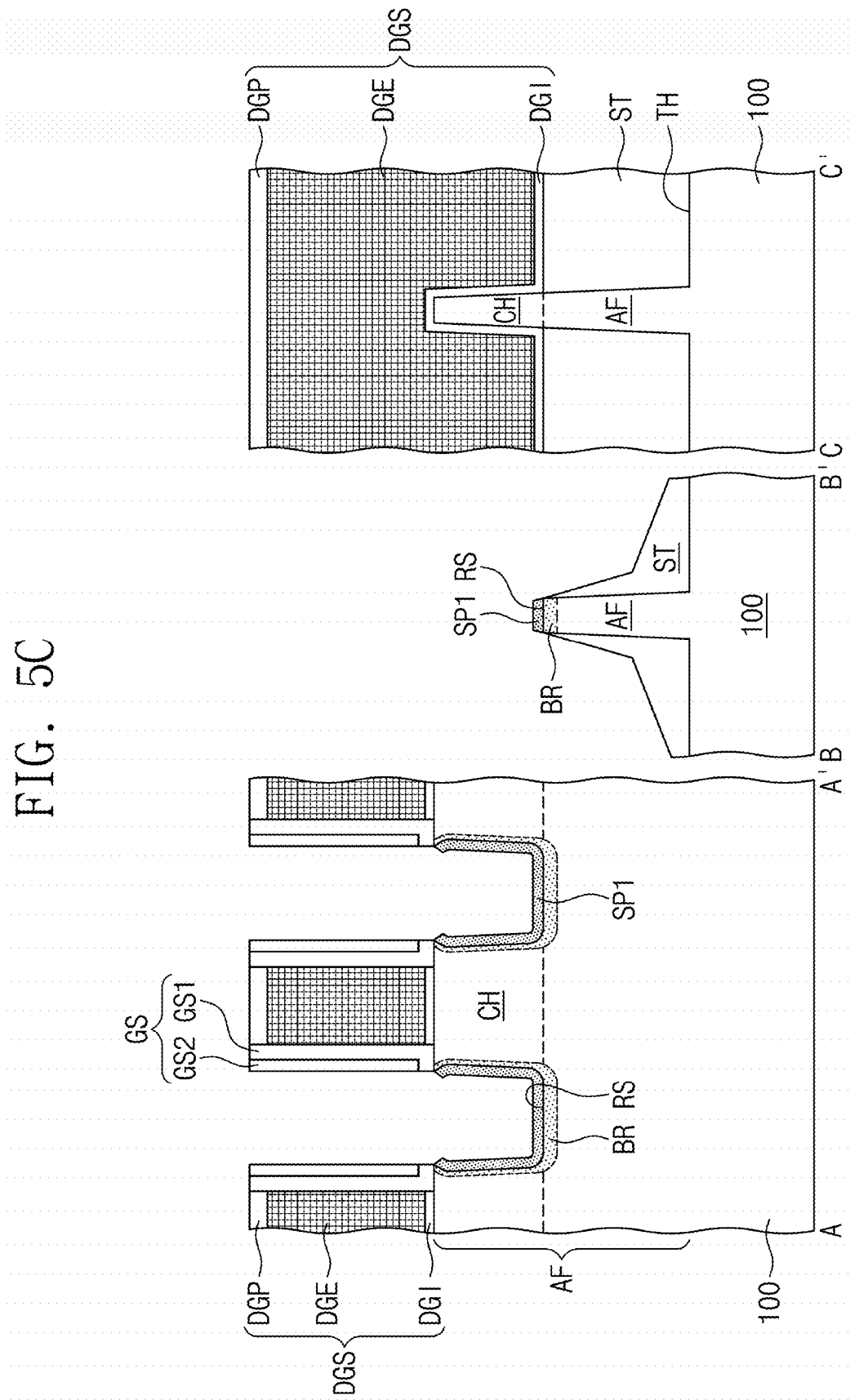

Referring to FIG. 5C, a first sub-source/drain pattern SP1 may be formed to cover the sidewall and/or the bottom of the recess region RS. The first sub-source/drain pattern SP1 may be formed by performing a selective epitaxial growth process while in-situ doping the second dopant (e.g., arsenic).

Tertiary-butyl-arsine ($C_4H_{11}As$), or TBA, may be used as a source material of the second dopant. Carbon included in TBA may be slightly doped in the in-situ doping process, and thus the first sub-source/drain pattern SP1 may include a small quantity of carbon. A heat treatment or annealing process may be additionally performed to active the second dopant.

Figure 5D:
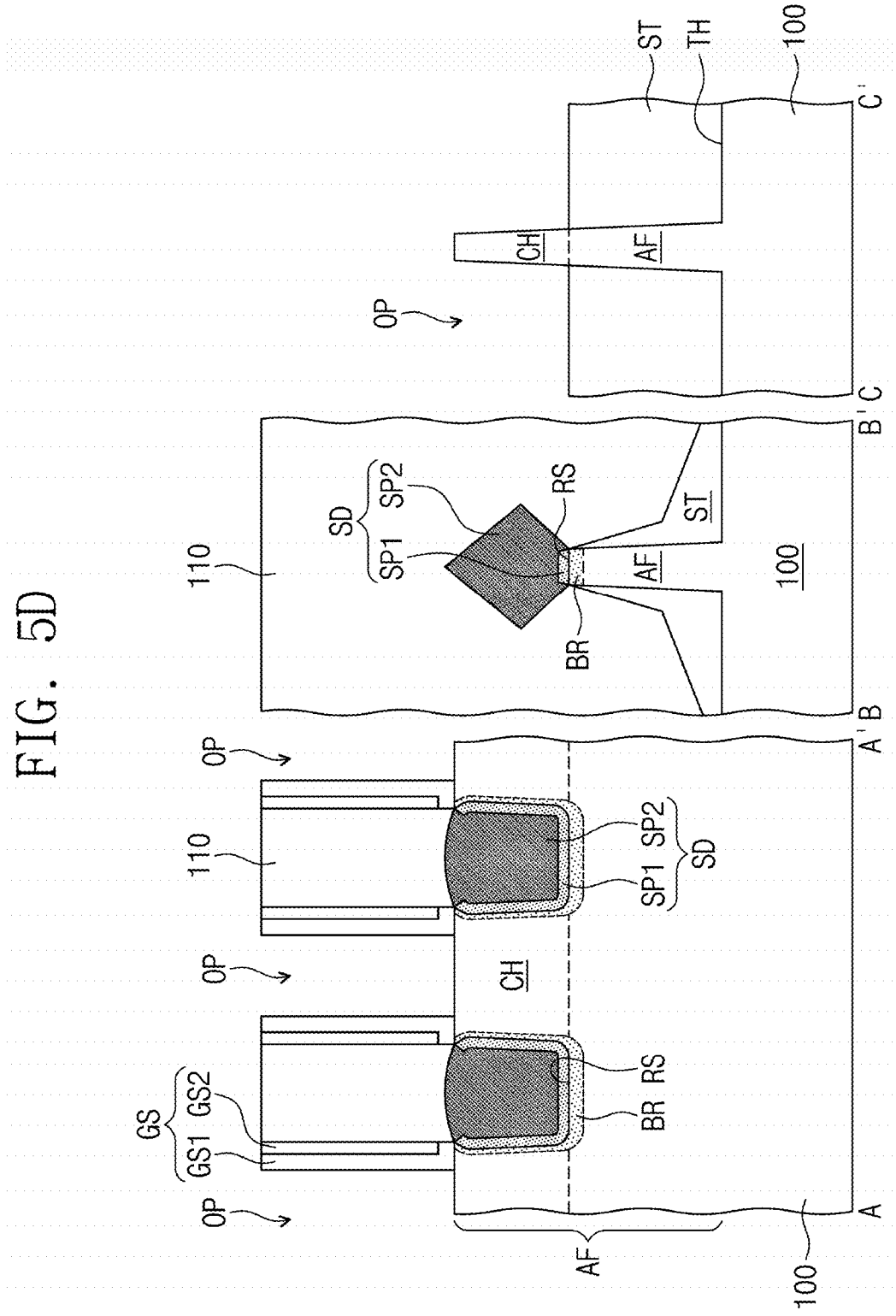

Referring to FIGS. 5C and 5D, a second sub-source/drain pattern SP2 may be formed to fill the recess region RS. The second sub-source/drain pattern SP2 may be formed by performing a selective epitaxial growth process while in-situ doping a first dopant (e.g., phosphorus) and/or the second dopant (e.g., arsenic). A heat treatment or annealing process may be additionally performed to activate the first dopant (e.g., phosphorus) and/or the second dopant (e.g., arsenic). After the formation of the second sub-source/drain pattern SP2, an interlayer dielectric layer 110 may be formed to fill a space between the dummy gate structures DGS. The dummy gate structure DGS may be removed to form an opening OP that exposes a sidewall of the gate spacer GS and a top surface of the active fin AF. Subsequently, referring to FIG. 2A, a gate dielectric layer GI, a gate electrode GE, and/or a gate capping pattern GP may be formed in the opening OP.

Figure 6:
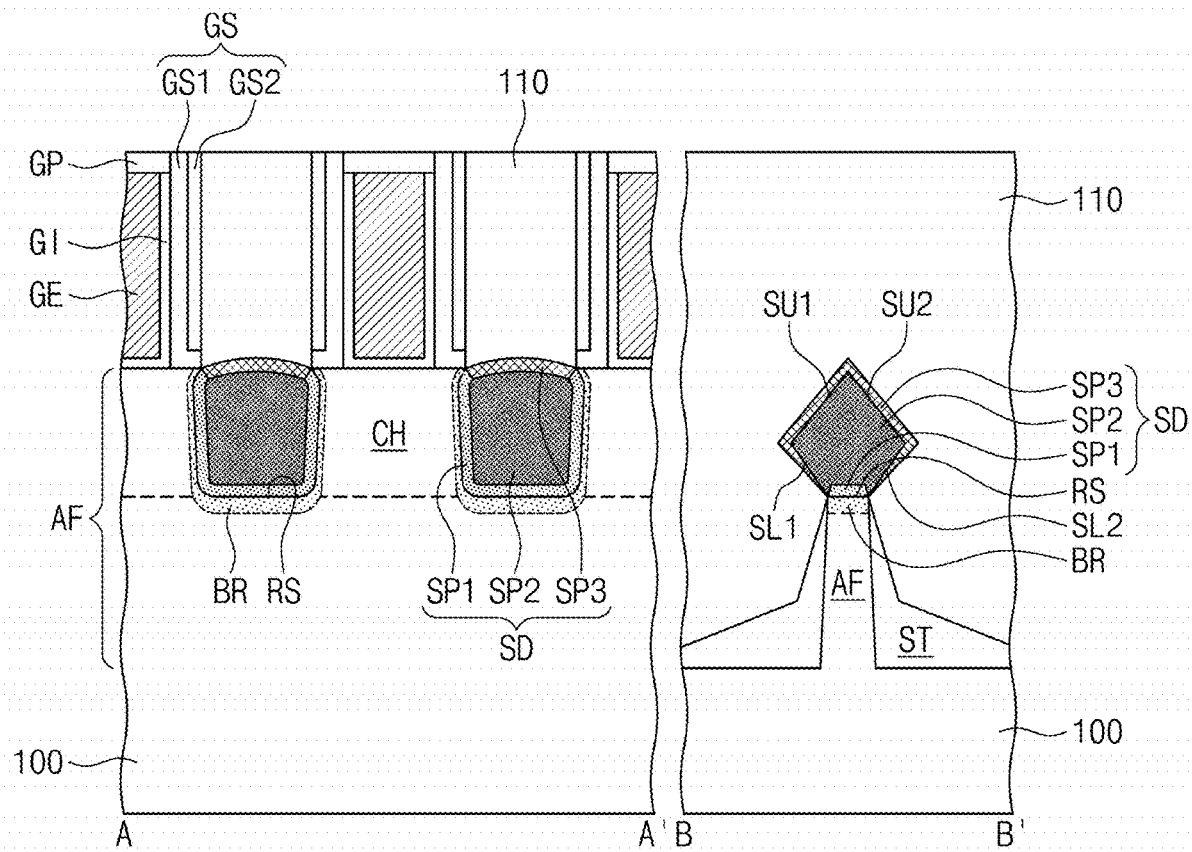
FIG. 6 illustrates a cross-sectional view taken along lines A-A' and B-B' of FIG. 1 depicting a source/drain pattern SD including three sub-source/drain patterns.

FIG. 6 illustrates a cross-sectional view taken along lines A-A' and B-B' of FIG. 1 depicting a source/drain pattern SD including three sub-source/drain patterns.

Referring to FIG. 6, a semiconductor device according to some example embodiments may be configured that the source/drain pattern SD may further include a third sub-source/drain pattern SP3 in addition to the first sub-source/drain pattern SP1 and the second sub-source/drain pattern SP2. The third sub-source/drain pattern SP3 may include the second dopant. For example, the third sub-source/drain pattern SP3 may be a silicon epitaxial layer doped with arsenic. The third sub-source/drain pattern SP3 may further include carbon doped therein. A concentration of carbon may be, for example, less than 0.2 at % (relative to silicon per unit volume, or relative to silicon concentration). The third sub-source/drain pattern SP3 may have a thickness (e.g., in the D3 direction, and/or in a direction orthogonal to a surface of the second sub-source/drain pattern SP2) ranging, for example, from 0 to 10 nm. A concentration of arsenic in the third sub-source/drain pattern SP3 may range, for example, from 0.2 at % to 4 at % (relative to silicon per unit volume, or relative to silicon concentration). The third sub-source/drain pattern SP3 may reduce or prevent the interlayer dielectric layer 110 from receiving the first dopant included in the second sub-source/drain pattern SP2. In a cross-section along line A-A' of FIG. 6, the second sub-source/drain pattern SP2 may not include the inflection C2 of FIG. 2B. The second sub-source/drain pattern SP2 may contact an upper portion of the first sub-source/drain pattern SP1. In a cross-section along line B-B' of FIG. 6, the third sub-source/drain pattern SP3 may contact the first and second lower sides SL1 and SL2 of the second sub-source/drain pattern SP2 and also contact the first and second upper sides SU1 and SU2 of the second sub-source/drain pattern SP2. Other configurations may be identical or similar to those discussed above with reference to FIG. 2A.

Although not shown, the contact plug CT of FIG. 4 may also be disposed on the semiconductor device of FIG. 6. The contact plug CT may contact an upper portion of the third sub-source/drain pattern SP3. Alternatively, the contact plug CT may penetrate the third sub-source/drain pattern SP3 and contact the second sub-source/drain pattern SP2.

Figure 7:
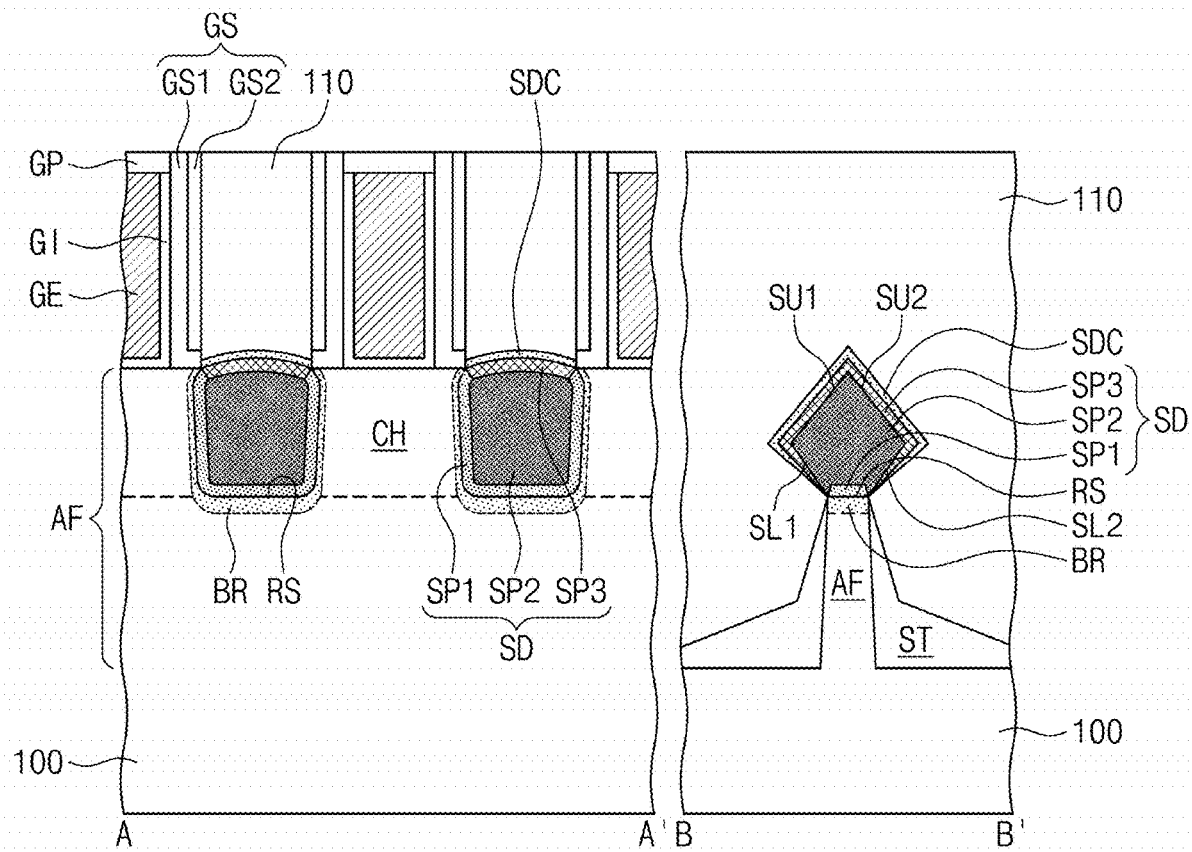
FIG. 7 illustrates a cross-sectional view taken along lines A-A' and B-B' of FIG. 1 depicting a source/drain pattern SD including three sub-source/drain patterns and a source/drain capping pattern SDC.

FIG. 7 illustrates a cross-sectional view taken along lines A-A' and B-B' of FIG. 1 depicting a source/drain pattern SD including three sub-source/drain patterns and a source/drain capping pattern SDC.

Referring to FIG. 7, a semiconductor device according to some example embodiments may further include a source/drain capping pattern SDC that covers the source/drain pattern SD in the structure shown in FIG. 6. The source/drain capping pattern SDC may exclude or limit all of the first and second dopants. For example, the source/drain capping pattern SDC may be a silicon epitaxial layer doped with no dopant. The source/drain capping pattern SDC may prevent or reduce arsenic possibly included in the third sub-source/drain pattern SP3 outgassing to the atmosphere. As a result, arsenic harmful to the human body may be prevented from being released into the atmosphere, or an amount of arsenic released into the atmosphere may be reduced, and to thereby build a safe process environment. The source/drain capping pattern SDC may have a thickness ranging, for example, from 0 to 3 nm. In a cross-section along line A-A' of FIG. 7, the source/drain capping pattern SDC may be in contact with a top surface of the third sub-source/drain pattern SP3 and spaced apart from the first and second sub-source/drain patterns SP1 and SP2. In a cross-sectional view along line B-B' of FIG. 7, the source/drain capping pattern SDC may be in contact with lower sides and upper sides of the third sub-source/drain pattern SP3 and spaced apart from the first and second sub-source/drain patterns SP1 and SP2. Other configurations may be identical or similar to those discussed with reference to FIG. 6.

Although not shown, the contact plug CT of FIG. 4 may also be additionally disposed on the semiconductor device of FIG. 7. The contact plug CT may penetrate the source/drain capping pattern SDC and contact an upper portion of the third sub-source/drain pattern SP3. Alternatively, the contact plug CT may penetrate the source/drain capping pattern SDC and the third sub-source/drain pattern SP3, and may contact the second sub-source/drain pattern SP2.

Figure 8:
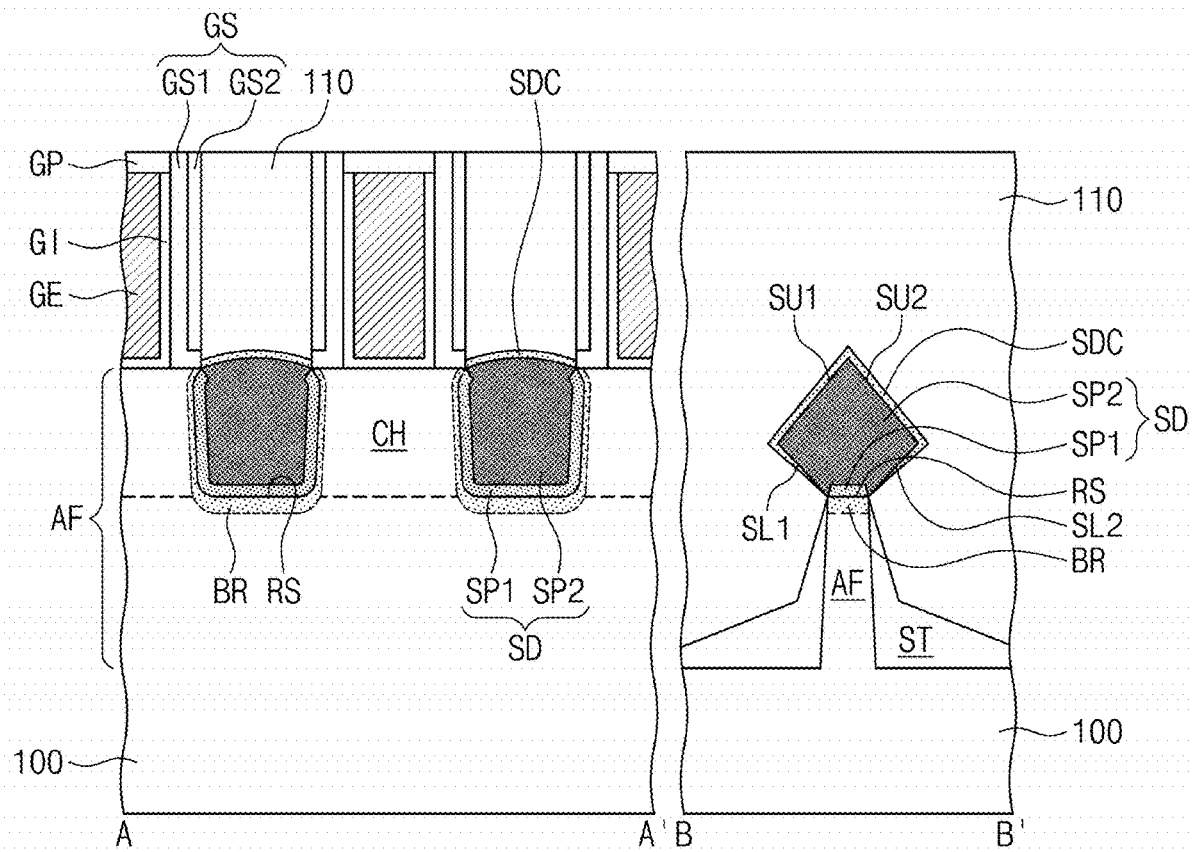
FIG. 8 illustrates a cross-sectional view taken along lines A-A' and B-B' of FIG. 1 depicting a source/drain pattern SD including two sub-source/drain patterns and a source/drain capping pattern SDC.

FIG. 8 illustrates a cross-sectional view taken along lines A-A' and B-B' of FIG. 1 depicting a source/drain pattern SD including two sub-source/drain patterns and a source/drain capping pattern SDC.

Referring to FIG. 8, a semiconductor device according to some example embodiments may include the diffusion reduction region BR, the source/drain pattern SD, and/or the source/drain capping pattern SDC. The diffusion reduction region BR and the source/drain pattern SD may have shapes the same as or similar to those discussed with reference to FIGS. 2A and 2B. The diffusion reduction region BR and the source/drain pattern SD may both include the second dopant, but exclude or limit the first dopant. The source/drain pattern SD may include the first sub-source/drain pattern SP1 and the second sub-source/drain pattern SP2.

The first sub-source/drain pattern SP1 and the second sub-source/drain pattern SP2 may both include the second dopant, but exclude or limit the first dopant. For example, the second dopant may be arsenic, and the first sub-source/drain pattern SP1 and the second sub-source/drain pattern SP2 may both be a silicon epitaxial layer doped with arsenic. However, the first sub-source/drain pattern SP1 and the second sub-source/drain pattern SP2 may have different concentrations of the second dopant from each other. For example, a concentration of the second dopant doped in the second sub-source/drain pattern SP2 may be greater than that of the second dopant doped in the first sub-source/drain pattern SP1. To be specific, a concentration of arsenic in the first sub-source/drain pattern SP1 may range from 0.2 at % to 4 at % (relative to silicon per unit volume, or relative to silicon concentration), and a concentration of arsenic in the second sub-source/drain pattern SP2 may range from 8 at % to 20 at % (relative to silicon per unit volume, or relative to silicon concentration). The first sub-source/drain pattern SP1 and the second sub-source/drain pattern SP2 may each further include carbon doped therein. A concentration of carbon may be, for example, less than 0.2 at % (relative to silicon per unit volume, or relative to silicon concentration). In some example embodiments, although the second sub-source/drain pattern SP2 includes the second dopant having relatively low activation efficiency, the second dopant may be heavily doped to reduce a resistance of the second sub-source/drain pattern SP2. Accordingly, it may be possible to provide a semiconductor device capable of preventing or reducing a short channel effect and also capable of increasing a signal transfer rate.

The source/drain capping pattern SDC may cover the second sub-source/drain pattern SP2. In a cross-section along line A-A' of FIG. 8, the source/drain capping pattern SDC may contact a top surface of the second sub-source/drain pattern SP2. In a cross-section along line B-B' of FIG. 8, the source/drain capping pattern SDC may contact the first and second lower sides SL1 and SL2 of the second sub-source/drain pattern SP2 and also contact the first and second upper sides SU1 and SU2 of the second sub-source/drain pattern SP2. The source/drain capping pattern SDC may prevent arsenic possibly included in the second sub-source/drain pattern SP2 from outgassing to the atmosphere, or reduce the amount of arsenic outgassed to the atmosphere, thereby building a safe process environment. Other configurations may be identical or similar to those discussed with reference to FIGS. 2A and 2B.

Figure 9:
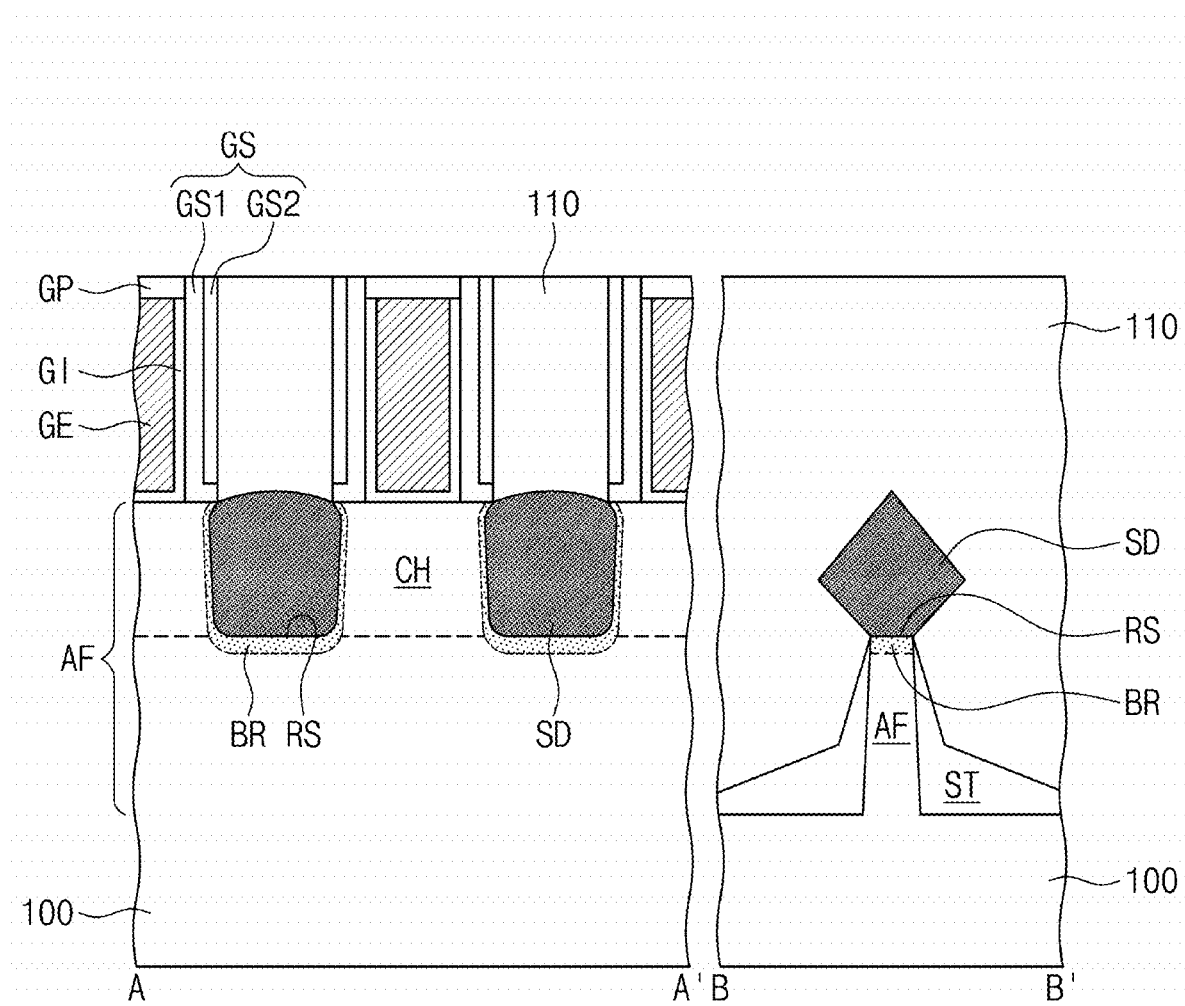
FIG. 9 illustrates a cross-sectional view taken along lines A-A' and B-B' of FIG. 1 depicting a source/drain pattern SD having a single semiconductor epitaxial layer.

FIG. 9 illustrates a cross-sectional view taken along lines A-A' and B-B' of FIG. 1 depicting a source/drain pattern SD having a single semiconductor epitaxial layer.

Referring to FIG. 9, a semiconductor device according to some example embodiments may include the diffusion reduction region BR and/or the source/drain pattern SD. The diffusion reduction region BR may have a shape the same as or similar to that discussed with reference to FIGS. 2A and 2B. The source/drain pattern SD may be a single semiconductor epitaxial layer, but not a semiconductor epitaxial layer that is divided into two or more pieces. The diffusion reduction region BR may include the second dopant (e.g., arsenic), but exclude or limit the first dopant (e.g., phosphorus). The source/drain pattern SD may include the first dopant or the second dopant. When the source/drain pattern SD includes the second dopant, a concentration of the second dopant doped in the source/drain pattern SD may be greater than that of the second dopant doped in the diffusion reduction region BR. A concentration of arsenic in the diffusion reduction region BR may range, for example, from 0.2 at % to 4 at % (relative to silicon per unit volume, or relative to silicon concentration). A concentration of arsenic in the source/drain pattern SD may range from 8 at % to 20 at % (relative to silicon per unit volume, or relative to silicon concentration). The diffusion reduction region BR may reduce the diffusion of the second dopant and thus may prevent or reduce a short channel effect. The source/drain pattern SD may include the second dopant heavily doped therein and thus may decrease in resistance. The source/drain patterns SD may further include carbon doped therein. A concentration of carbon may be, for example, less than 0.2 at % (relative to silicon per unit volume, or relative to silicon concentration). Other configurations and effects may be identical or similar to those discussed with reference to FIGS. 2A and 2B.

Figure 10:
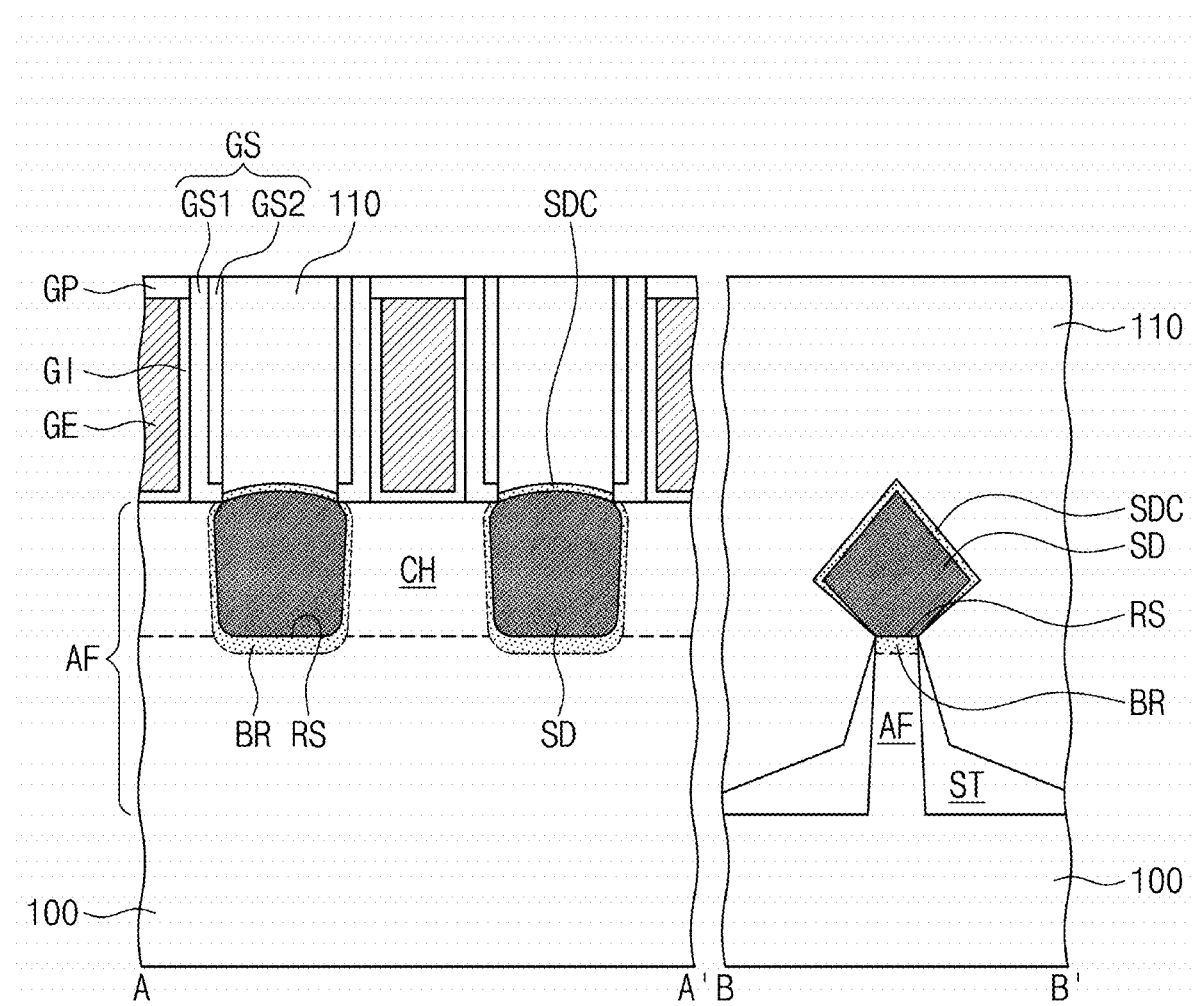
FIG. 10 illustrates a cross-sectional view taken along lines A-A' and B-B' of FIG. 1 depicting a source/drain pattern SD having a single semiconductor epitaxial layer and a source/drain capping pattern SDC.

FIG. 10 illustrates a cross-sectional view taken along lines A-A' and B-B' of FIG. 1 depicting a source/drain pattern SD having a single semiconductor epitaxial layer and a source/drain capping pattern SDC.

Referring to FIG. 10, a semiconductor device according to some example embodiments may include the diffusion reduction region BR, the source/drain pattern SD, and/or the source/drain capping pattern SDC. The diffusion reduction region BR may have a shape the same as or a similar shape to that discussed with reference to FIGS. 2A and 2B. The source/drain pattern SD may be a single semiconductor epitaxial layer, but not a semiconductor epitaxial layer that is divided into two or more pieces.

In FIG. 10, the diffusion reduction region BR may include the second dopant (e.g., arsenic), but exclude or limit the first dopant (e.g., phosphorus). The source/drain pattern SD may exclude or limit the second dopant (e.g., arsenic), but include the first dopant (e.g., phosphorus). A concentration of arsenic in the diffusion reduction region BR may range from 0.2 at % to 4 at % (relative to silicon per unit volume, or relative to silicon concentration). For example, the source/drain pattern SD may be a silicon epitaxial layer doped with phosphorus. A concentration of phosphorus may range, for example, from 4 at % to 8 at % (relative to silicon per unit volume, or relative to silicon concentration). The diffusion reduction region BR may reduce the diffusion of the second dopant and thus may prevent or reduce a short channel effect.

For another example, the diffusion reduction region BR and the source/drain pattern SD may both include the second dopant (e.g., arsenic), but exclude or limit the first dopant (e.g., phosphorus). A concentration of the second dopant doped in the source/drain pattern SD may be greater than that of the second dopant doped in the diffusion reduction region BR. A concentration of arsenic in the diffusion reduction region BR may range, for example, from 0.2 at % to 4 at % (relative to silicon per unit volume, or relative to silicon concentration). A concentration of arsenic in the source/drain pattern SD may range from 8 at % to 20 at % (relative to silicon per unit volume, or relative to silicon concentration). The diffusion reduction region BR may reduce the diffusion of the second dopant and thus may prevent or reduce a short channel effect. The source/drain pattern SD may include the second dopant heavily doped therein and thus may decrease in resistance. Other configurations and effects may be identical or similar to those discussed with reference to FIGS. 2A and 2B.

The source/drain capping pattern SDC may cover the source/drain pattern SD. In a cross-section along line A-A' of FIG. 10, the source/drain capping pattern SDC may contact a top surface of the source/drain pattern SD. In a cross-section along line B-B' of FIG. 10, the source/drain capping pattern SDC may contact lower sides and upper sides of the source/drain pattern SD. The source/drain capping pattern SDC may prevent arsenic possibly included therein from outgassing to the atmosphere, or reduce the amount of arsenic outgassed to the atmosphere, thereby building a safe process environment. Other configurations may be identical or similar to those discussed above with reference to FIG. 9.

Figure 11:
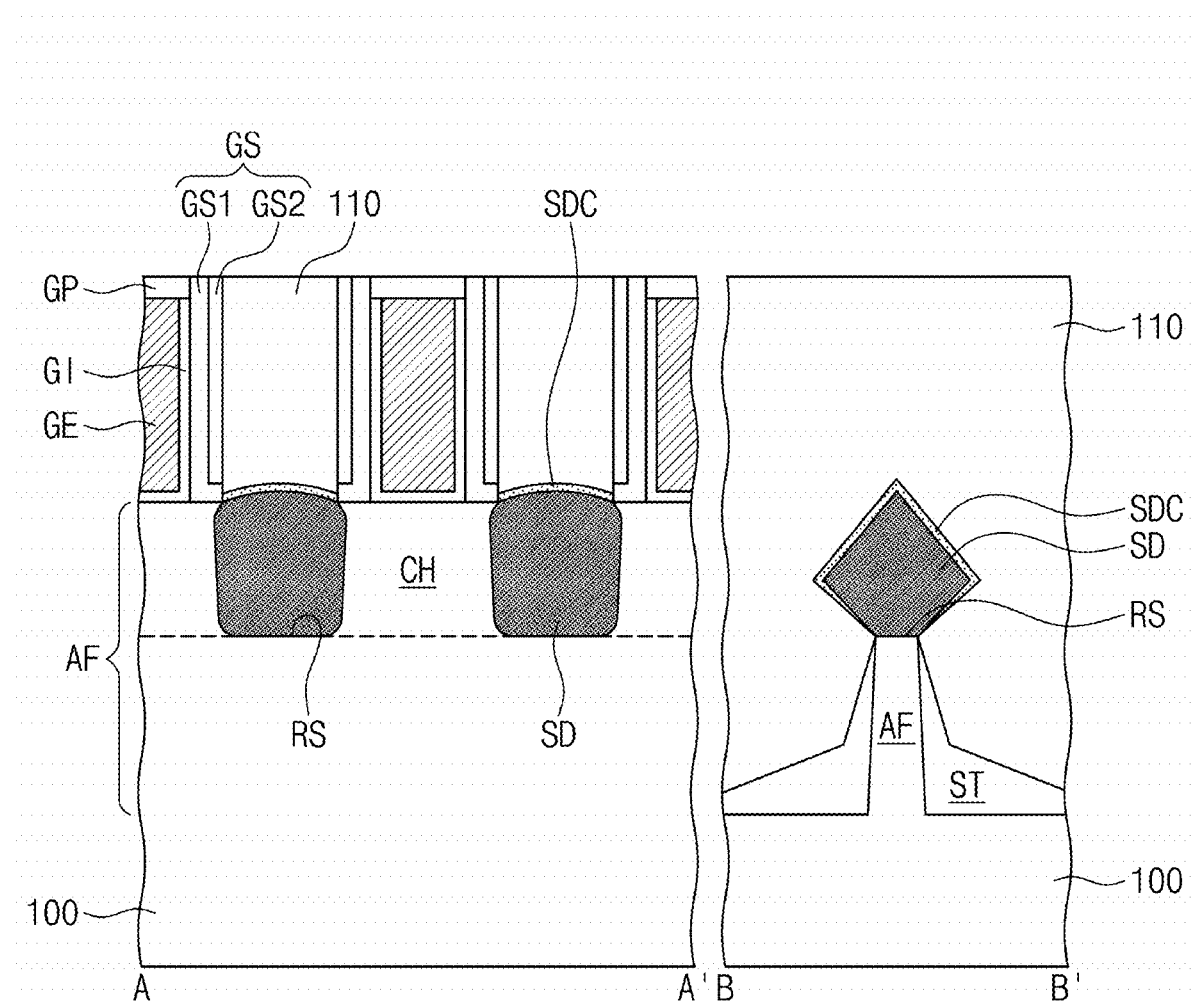
FIG. 11 illustrates a cross-sectional view taken along lines A-A' and B-B' of FIG. 1 depicting a source/drain pattern SD having a single semiconductor epitaxial layer without a diffusion reduction region BR, and a source/drain capping pattern SDC.

FIG. 11 illustrates a cross-sectional view taken along lines A-A' and B-B' of FIG. 1 depicting a source/drain pattern SD having a single semiconductor epitaxial layer without a diffusion reduction region BR, and a source/drain capping pattern SDC.

Referring to FIG. 11, a semiconductor device according to some example embodiments may not include the diffusion reduction region BR in FIG. 10. The semiconductor device may include the source/drain pattern SD and/or the source/drain capping pattern SDC that covers the source/drain pattern SD. The source/drain pattern SD may include the second dopant (e.g., arsenic) whose diffusion coefficient is less than that of phosphorus. The source/drain pattern SD may be, for example, a single-layered silicon epitaxial layer doped with arsenic. A concentration of arsenic in the source/drain pattern SD may range from 8 at % to 20 at % (relative to silicon per unit volume, or relative to silicon concentration). The source/drain pattern SD may include the second dopant heavily doped therein and thus may decrease in resistance. In addition, a diffusion coefficient of the second dopant may be small to prevent or reduce a short channel effect.

The source/drain capping pattern SDC may cover the source/drain pattern SD. The source/drain capping pattern SDC may prevent arsenic possibly included therein from outgassing to the atmosphere, or reduce the amount of arsenic outgassed to the atmosphere, thereby building a safe process environment. Other configurations may be identical or similar to those discussed with reference to FIG. 10.

Figure 12:
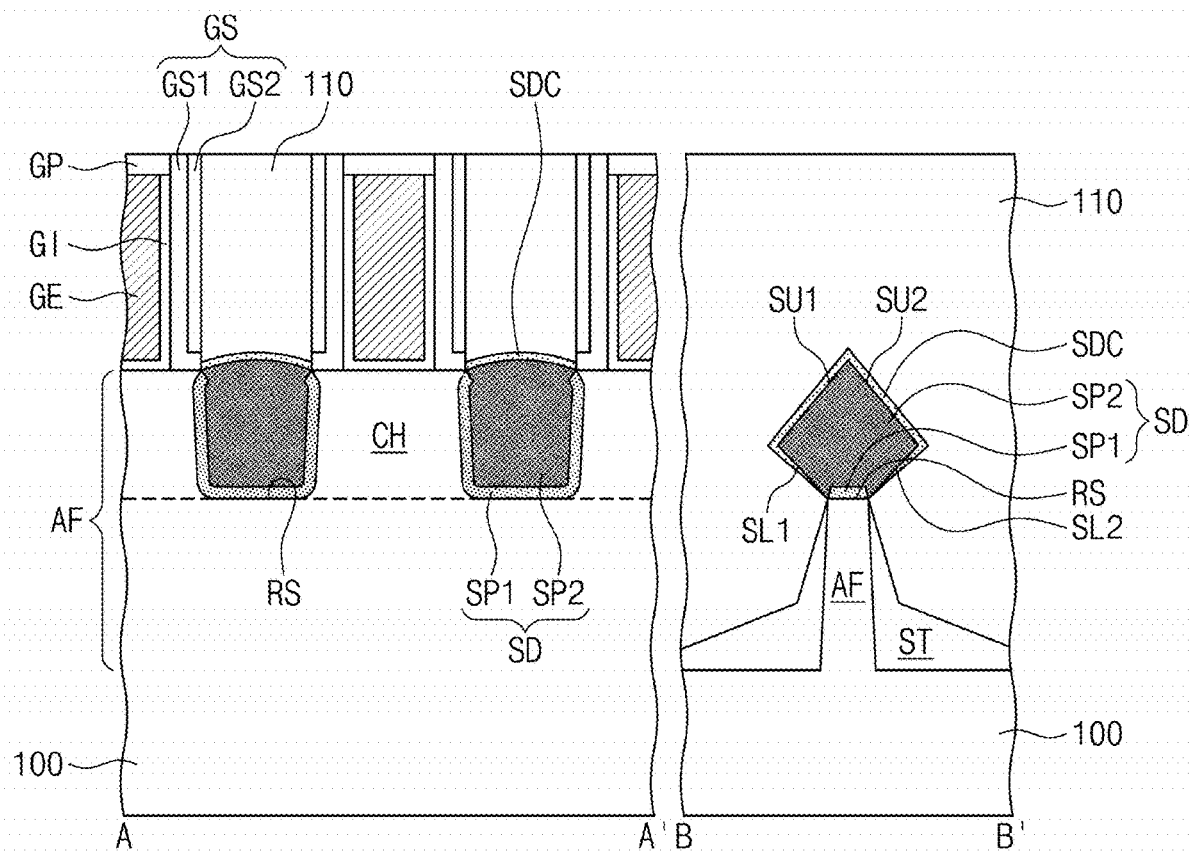
FIG. 12 illustrates a cross-sectional view taken along lines A-A' and B-B' of FIG. 1 depicting a source/drain pattern SD including two sub-source/drain patterns without a diffusion reduction region BR, and a source/drain capping pattern SDC.

FIG. 12 illustrates a cross-sectional view taken along lines A-A' and B-B' of FIG. 1 depicting a source/drain pattern SD including two sub-source/drain patterns without a diffusion reduction region BR, and a source/drain capping pattern SDC.

Referring to FIG. 12, a semiconductor device according to some example embodiments may not include the diffusion reduction region BR in FIG. 2A. The semiconductor device may include the source/drain pattern SD and the source/drain capping pattern SDC that covers the source/drain pattern SD. The source/drain pattern SD may include the first sub-source/drain pattern SP1 and the second sub-source/drain pattern SP2. The first sub-source/drain pattern SP1 may include the second dopant (e.g., arsenic) whose diffusion coefficient is less than that of phosphorus. The second sub-source/drain pattern SP2 may include phosphorus (e.g., the first dopant) and/or the second dopant (e.g., arsenic). When the second sub-source/drain pattern SP2 includes the second dopant, a concentration of the second dopant doped in the second sub-source/drain pattern SP2 may be greater than that of the second dopant doped in the first sub-source/drain pattern SP1.

In some example embodiments, the first sub-source/drain pattern SP1 alone without the diffusion reduction region BR may serve to reduce the diffusion of the second dopant or the first dopant included in the second sub-source/drain pattern SP2. Therefore, a short channel effect may be prohibited or reduced. The source/drain capping pattern SDC may cover the source/drain pattern SD. The source/drain capping pattern SDC may prevent arsenic possibly included therein from outgassing to the atmosphere, or reduce the amount of arsenic outgassed to the atmosphere, thereby building a safe process environment. Other configurations may be identical or similar to those discussed above with reference to FIG. 2A.

Figure 13:
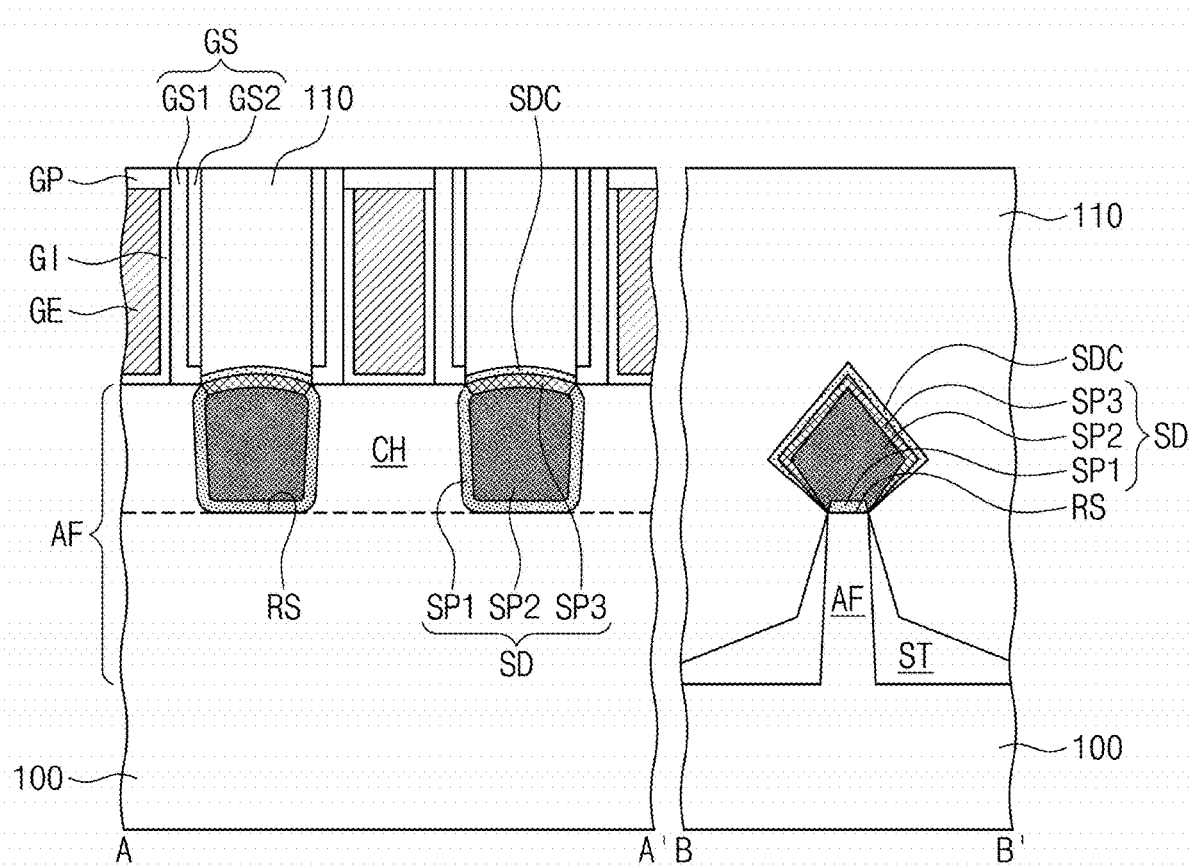
FIG. 13 illustrates a cross-sectional view taken along lines A-A' and B-B' of FIG. 1 depicting a source/drain pattern SD including three sub-source/drain patterns without a diffusion reduction region BR, and a source/drain capping pattern SDC.

FIG. 13 illustrates a cross-sectional view taken along lines A-A' and B-B' of FIG. 1 depicting a source/drain pattern SD including three sub-source/drain patterns without a diffusion reduction region BR, and a source/drain capping pattern SDC.

Referring to FIG. 13, a semiconductor device according to some example embodiments may not include the diffusion reduction region BR in FIG. 7. The semiconductor device may include the source/drain pattern SD and the source/drain capping pattern SDC that covers the source/drain pattern SD. The source/drain pattern SD may include the first, second, and third sub-source/drain patterns SP1, SP2, and SP3. Detailed configurations and effects may be identical or similar to those discussed with reference to FIG. 7, except for the diffusion reduction region BR.

Figure 14:
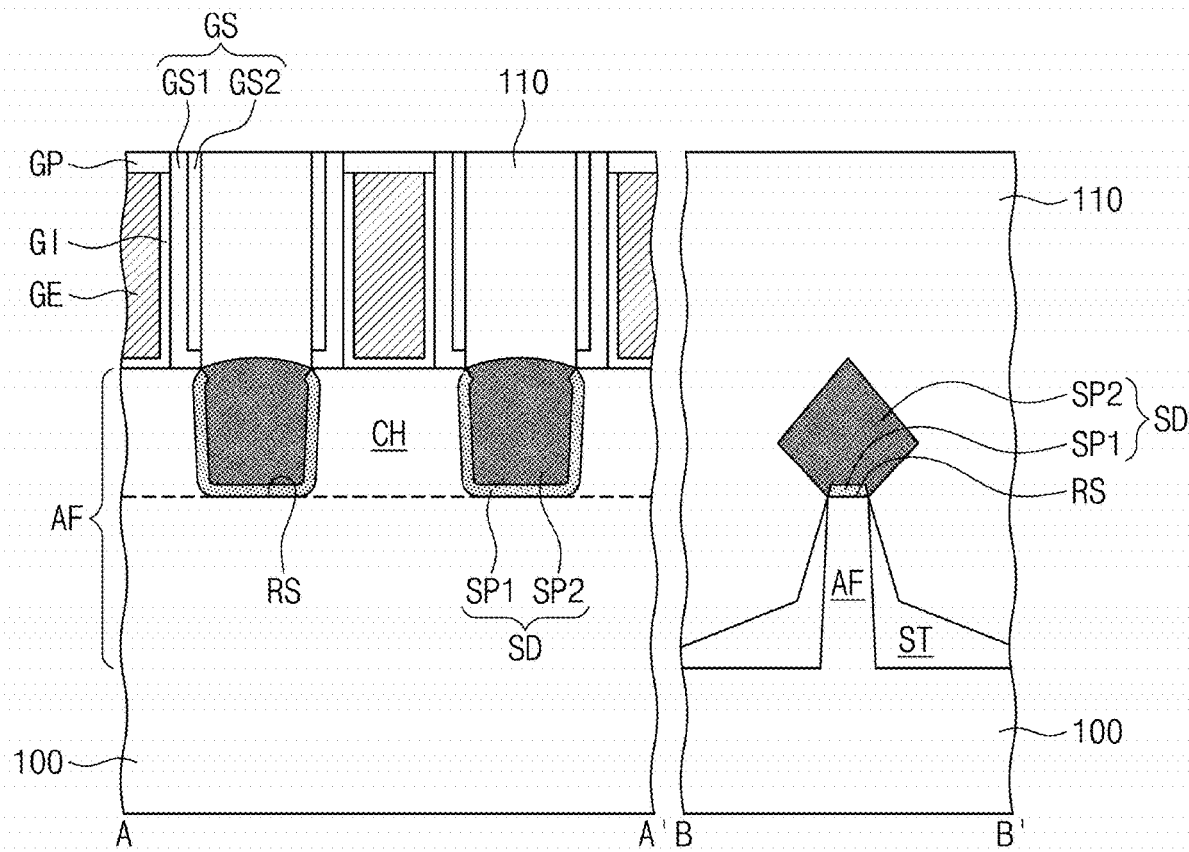
FIG. 14 illustrates a cross-sectional view taken along lines A-A' and B-B' of FIG. 1 depicting a source/drain pattern SD including two sub-source/drain patterns without a diffusion reduction region BR.

FIG. 14 illustrates a cross-sectional view taken along lines A-A' and B-B' of FIG. 1 depicting a source/drain pattern SD including two sub-source/drain patterns without a diffusion reduction region BR.

Referring to FIG. 14, a semiconductor device according to some example embodiments may not include the diffusion reduction region BR in FIG. 2A. The semiconductor device may include the source/drain pattern SD. The source/drain pattern SD may include the first sub-source/drain pattern SP1 and the second sub-source/drain pattern SP2. The first sub-source/drain pattern SP1 may include the second dopant (e.g., arsenic) whose diffusion coefficient is less than that of phosphorus. The second sub-source/drain pattern SP2 may include phosphorus (e.g., the first dopant) and/or the second dopant (e.g., arsenic). When the second sub-source/drain pattern SP2 includes the second dopant, a concentration of the second dopant doped in the second sub-source/drain pattern SP2 may be greater than that of the second dopant doped in the first sub-source/drain pattern SP1. In some example embodiments, the first sub-source/drain pattern SP1 alone without the diffusion reduction region BR may serve to reduce the diffusion of the second dopant or the first dopant included in the second sub-source/drain pattern SP2. Therefore, a short channel effect may be prohibited or reduced. Other configurations and effects may be identical or similar to those discussed with reference to FIGS. 2A and 2B.

Figure 15:
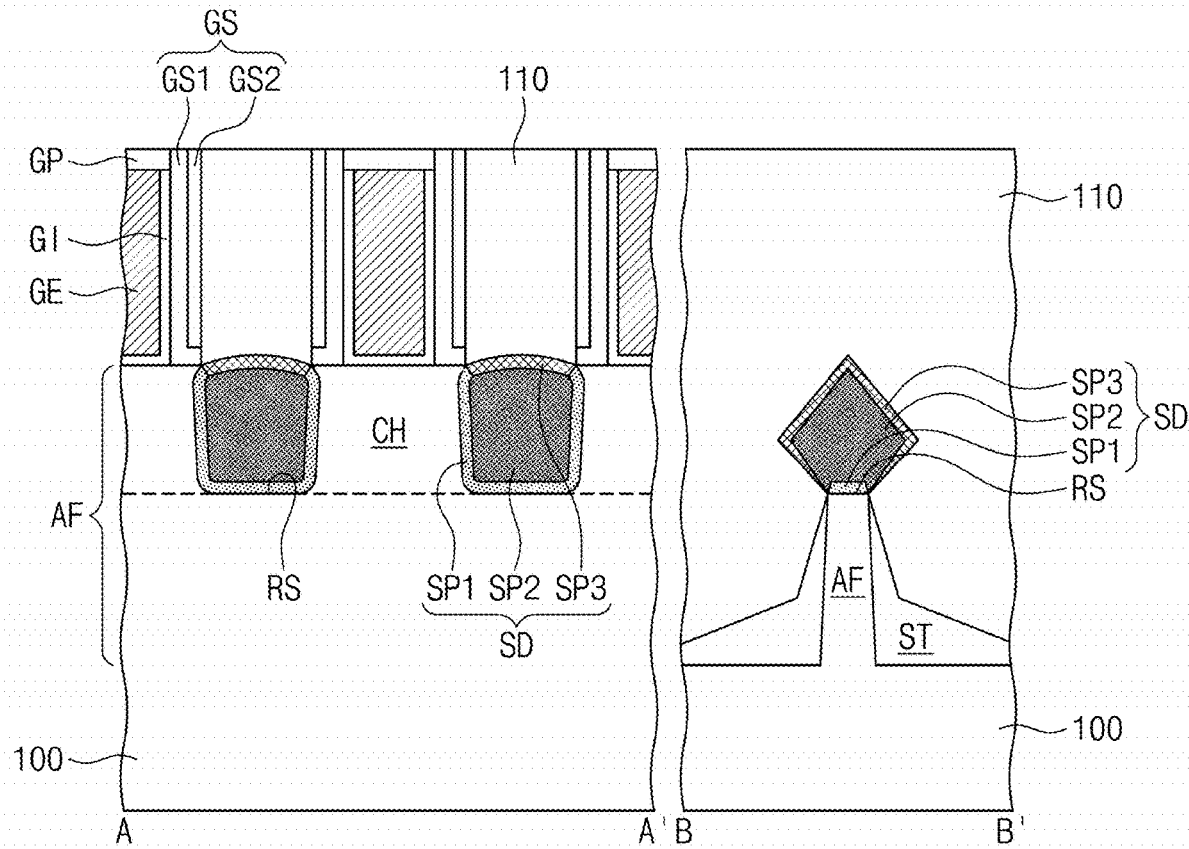
FIG. 15 illustrates a cross-sectional view taken along lines A-A' and B-B' of FIG. 1 depicting a source/drain pattern SD including three sub-source/drain patterns without a diffusion reduction region BR.

FIG. 15 illustrates a cross-sectional view taken along lines A-A' and B-B' of FIG. 1 depicting a source/drain pattern SD including three sub-source/drain patterns without a diffusion reduction region BR.

Referring to FIG. 15, a semiconductor device according to some example embodiments may not include the diffusion reduction region BR in FIG. 6. The semiconductor device may include the source/drain pattern SD. The source/drain pattern SD may include the first, second, and third sub-source/drain patterns SP1, SP2, and SP3. Detailed configurations and effects may be identical or similar to those discussed with reference to FIG. 6, except for the diffusion reduction region BR.

Figure 16:
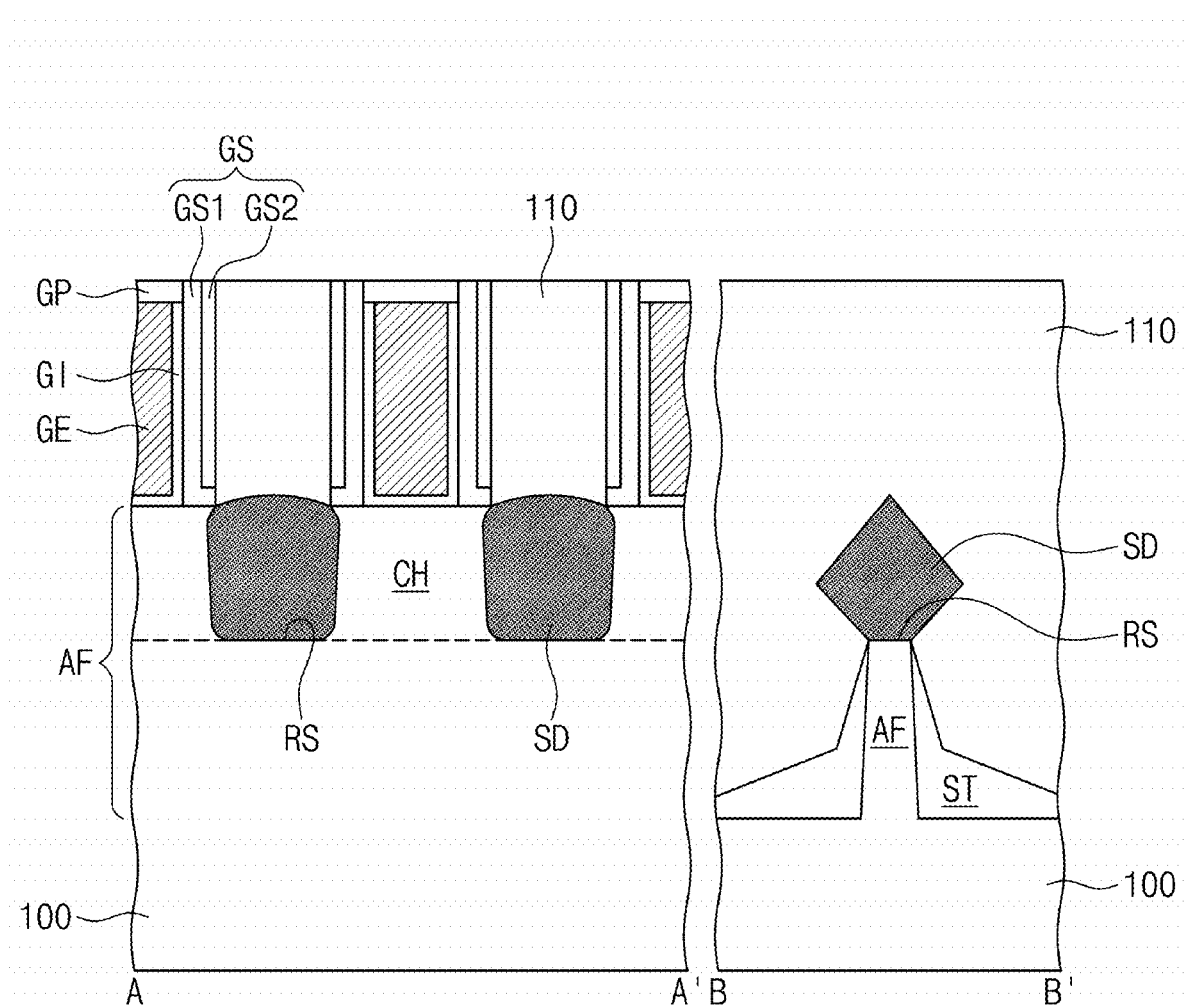
FIG. 16 illustrates a cross-sectional view taken along lines A-A' and B-B' of FIG. 1 depicting a source/drain pattern SD having a single semiconductor epitaxial layer without a diffusion reduction region BR.

FIG. 16 illustrates a cross-sectional view taken along lines A-A' and B-B' of FIG. 1 depicting a source/drain pattern SD having a single semiconductor epitaxial layer without a diffusion reduction region BR.

Referring to FIG. 16, a semiconductor device according to some example embodiments may not include the diffusion reduction region BR in FIG. 9. The source/drain pattern SD may be a single semiconductor epitaxial layer, but not a semiconductor epitaxial layer that is divided into two or more pieces. The source/drain pattern SD may exclude or limit the first dopant (e.g., phosphorus), but include the second dopant (e.g., arsenic). For example, the source/drain pattern SD may be a silicon epitaxial layer doped with arsenic. A concentration of arsenic in the source/drain pattern SD may range from 8 at % to 20 at % (relative to silicon per unit volume, or relative to silicon concentration). The source/drain pattern SD may be doped with the second dopant whose diffusion coefficient is relatively low, and thus a short channel effect may be prevented or reduced. The source/drain pattern SD may include the second dopant heavily doped therein and thus may decrease in resistance. Other configurations and effects may be identical or similar to those discussed with reference to FIGS. 2A and 2B.

A semiconductor device according to some example embodiments of the present inventive concepts may prevent or reduce short channel effects, increase in charge mobility, and decrease in resistance.

Although some example embodiments of the present inventive concepts have been discussed with reference to accompanying figures, it will be understood that various changes in form and details may be made therein without departing from the spirit and scope of the present inventive concepts. It therefore will be understood that the some example embodiments described above are just illustrative but not limitative in all aspects.

Spatially relative terms, such as "beneath," "below," "lower," "above," "upper," "cover" and the like, may be used herein for ease of description to describe one element or feature's relationship to another element(s) or feature(s) as illustrated in the figures. For example, as used herein, the terms "upper," "higher," "on" and/or "top" may refer to an element or feature further in the third direction D3 (as depicted in FIG. 1) with respect to another element or feature, and the terms "lower" and/or "below" may refer to an element or feature further in a direction opposite the third direction D3 with respect to another element or feature. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

It will be understood that when an element is referred to as being "connected" or "coupled" to another element, it can be directly connected or coupled to the other element or intervening elements may be present. As used herein the term "and/or" includes any and all combinations of one or more of the associated listed items. Also, as used herein, the term "fill" may describe partially or completely filling, and the term "cover" may describe partially or completely covering.

Some example embodiments are described herein with reference to cross-sectional illustrations that are schematic illustrations of example embodiments. As such, variations from the shapes of the illustrations as a result, for example, of manufacturing techniques and/or tolerances, are to be expected. Thus, some example embodiments should not be construed as limited to the particular shapes of regions illustrated herein but are to include deviations in shapes that result, for example, from manufacturing.

What is claimed is:

1. A semiconductor device, comprising:
an active fin that protrudes from a substrate and forms a plurality of recess regions spaced apart from each other;
a gate pattern between the plurality of recess regions that covers a lateral surface and a top surface of the active fin;
a plurality of source/drain patterns in the plurality of recess regions; and
a diffusion reduction region adjacent to each of a plurality of bottoms of the plurality of recess regions and each of a plurality of sidewalls of the plurality of recess regions, the diffusion reduction region including a dopant having a lower diffusion coefficient than phosphorus (P),
wherein each of the plurality of source/drain patterns includes:
a first sub-source/drain pattern that covers each of the plurality of bottoms of the plurality of recess regions and each of the plurality of sidewalls of the plurality of recess regions, the first sub-source/drain pattern including the dopant; and
a second sub-source/drain pattern that fills each of plurality of the recess regions,
wherein the second sub-source/drain pattern excludes the dopant and includes phosphorus.

2. The semiconductor device of claim 1, wherein the dopant is arsenic.

3. The semiconductor device of claim 1, wherein each of the plurality of source/drain patterns includes a third sub-source/drain pattern on the second sub-source/drain pattern, the third sub-source/drain pattern including the dopant.

4. The semiconductor device of claim 3, further comprising:
a plurality of source/drain capping patterns excluding the dopant, the third sub-source/drain pattern being covered by a source/drain capping pattern among the plurality of source/drain capping patterns.

5. The semiconductor device of claim 1, further comprising:
a plurality of source/drain capping patterns excluding the dopant, each of the plurality of source/drain patterns being covered by a respective source/drain capping pattern among the plurality of source/drain capping patterns, and each of the plurality of source/drain patterns including the dopant.

6. The semiconductor device of claim 1, wherein the diffusion reduction region further includes carbon,
wherein a concentration of the carbon in the diffusion reduction region is less than 0.2 at %.

7. The semiconductor device of claim 1, further comprising:
a gate spacer covering a sidewall of the gate pattern,
wherein the diffusion reduction region overlaps the gate spacer but does not overlap the gate pattern.

8. The semiconductor device of claim 7, wherein the gate spacer includes:
a first gate spacer covering a sidewall of the gate pattern;
a second gate spacer covering a sidewall of the first gate spacer,
wherein the first gate spacer includes a first portion interposed between the gate pattern and the second gate spacer and a second portion covering a bottom surface of the second gate spacer,
wherein a top end of each of the source/drain patterns is lower than the bottom surface of the second gate spacer.

9. The semiconductor device of claim 1, wherein the second sub-source/drain pattern covers a sidewall of the first sub-source/drain pattern at a bottom of each of the plurality of recess regions.

10. A semiconductor device, comprising:
an active fin that protrudes from a substrate and forms a plurality of recess regions spaced apart from each other;
a gate pattern between the plurality of recess regions that covers a top surface and a lateral surface of the active fin;
a plurality of source/drain patterns in the plurality of recess regions, each of the plurality of source/drain patterns including a dopant having a lower diffusion coefficient than phosphorus (P); and
a plurality of source/drain capping patterns that covers the plurality of source/drain patterns,
wherein the semiconductor device further comprises a diffusion reduction region including carbon,
wherein a concentration of the carbon in the diffusion reduction region is less than 0.2 at %.

11. The semiconductor device of claim 10, wherein each of the plurality of source/drain capping patterns excludes the dopant.

12. The semiconductor device of claim 10, wherein each of the plurality of source/drain patterns includes:
a first sub-source/drain pattern that covers a bottom and a sidewall of each of the plurality of recess regions, the first sub-source/drain pattern including the dopant; and
a second sub-source/drain pattern that fills each of the plurality of recess regions.

13. The semiconductor device of claim 12, wherein the second sub-source/drain pattern excludes the dopant and includes phosphorus.

14. The semiconductor device of claim 12, wherein each of the plurality of source/drain patterns includes a third sub-source/drain pattern on the second sub-source/drain pattern, the third sub-source/drain pattern including the dopant.

15. A semiconductor device, comprising:
an active fin that protrudes from a substrate and forms a plurality of recess regions spaced apart from each other;
a gate pattern between the recess regions that covers a lateral surface and a top surface of the active fin;
a first gate spacer covering a sidewall of the gate pattern;
a second gate spacer covering a sidewall of the first gate spacer;
a plurality of source/drain patterns in each of the plurality of recess regions, each of the plurality of source/drain patterns including a first dopant; and
a diffusion reduction region adjacent to each of a plurality of bottoms of the plurality of recess regions and each of a plurality of sidewalls of the plurality of recess regions, the diffusion reduction region including a second dopant having a same conductivity type as the first dopant, and the second dopant having a lower diffusion coefficient than the first dopant,
wherein the first gate spacer includes a first portion interposed between the gate pattern and the second gate spacer and a second portion covering a bottom surface of the second gate spacer, and wherein a top end of each of the source/drain patterns is lower than the bottom surface of the second gate spacer.

16. The semiconductor device of claim 15, wherein
the first dopant is phosphorus; and
the second dopant is arsenic.

17. The semiconductor device of claim 15, wherein each of the plurality of source/drain patterns includes:
- a first sub-source/drain pattern that covers each of the plurality of bottoms of the plurality of recess regions and each of the plurality of sidewalls of the plurality of recess regions, the first sub-source/drain pattern including the second dopant; and
- a second sub-source/drain pattern that fills each of the plurality of recess regions, the second sub-source/drain pattern including the first dopant.

18. The semiconductor device of claim 17, wherein each of the plurality of source/drain patterns includes a third sub-source/drain pattern on the second sub-source/drain pattern, the third sub-source/drain pattern including the second dopant.

19. The semiconductor device of claim 18, further comprising:
a plurality of source/drain capping patterns excluding the second dopant, the third sub-source/drain pattern being covered by a source/drain capping pattern among the plurality of source/drain capping patterns.

20. The semiconductor device of claim 15, further comprising:
a plurality of source/drain capping patterns on the plurality of source/drain patterns, the plurality of source/drain capping patterns excluding the second dopant.

* * * * *